United States Patent
Lee

(10) Patent No.: US 10,403,633 B2
(45) Date of Patent: Sep. 3, 2019

(54) THREE-DIMENSIONAL SEMICONDUCTOR DEVICE

(71) Applicant: SK hynix Inc., Gyeonggi-do (KR)

(72) Inventor: Nam Jae Lee, Chungcheongbuk-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 15/936,602

(22) Filed: Mar. 27, 2018

(65) Prior Publication Data

US 2019/0081052 A1 Mar. 14, 2019

(30) Foreign Application Priority Data

Sep. 12, 2017 (KR) .......................... 10-2017-0116715

(51) Int. Cl.
| | |
|---|---|
| *H01L 27/11* | (2006.01) |
| *H01L 27/1157* | (2017.01) |
| *H01L 27/11524* | (2017.01) |
| *H01L 27/11556* | (2017.01) |
| *H01L 27/11565* | (2017.01) |
| *H01L 27/11519* | (2017.01) |
| *H01L 27/11582* | (2017.01) |
| *H01L 27/11573* | (2017.01) |
| *H01L 27/11529* | (2017.01) |

(52) U.S. Cl.
CPC .... *H01L 27/1157* (2013.01); *H01L 27/11519* (2013.01); *H01L 27/11524* (2013.01); *H01L 27/11529* (2013.01); *H01L 27/11556* (2013.01); *H01L 27/11565* (2013.01); *H01L 27/11573* (2013.01); *H01L 27/11582* (2013.01)

(58) Field of Classification Search
CPC ......... H01L 27/11507; H01L 27/11529; H01L 27/11573; H01L 27/11582; H01L 27/11575; H01L 27/11556; H01L 27/11524; H01L 27/11519
See application file for complete search history.

(56) References Cited

U.S. PATENT DOCUMENTS

| | | | |
|---|---|---|---|
| 8,178,917 B2 * | 5/2012 | Tanaka | H01L 27/115 257/324 |
| 9,780,034 B1 * | 10/2017 | Tsutsumi | H01L 27/11565 |
| 2017/0207232 A1 * | 7/2017 | You | H01L 27/11521 |
| 2017/0338241 A1 * | 11/2017 | Lee | H01L 27/0688 |
| 2018/0261613 A1 * | 9/2018 | Ariyoshi | H01L 23/5226 |

FOREIGN PATENT DOCUMENTS

| | | |
|---|---|---|
| KR | 1020150006531 | 1/2015 |
| KR | 1020150142366 | 12/2015 |
| KR | 1020160109971 | 9/2016 |
| KR | 1020170036877 | 4/2017 |

* cited by examiner

Primary Examiner — William Coleman
(74) Attorney, Agent, or Firm — IP & T Group LLP

(57) ABSTRACT

The semiconductor device include a lower insulating layer; a gate stack disposed over the lower insulating layer; a plurality of supports extending from the lower insulating layer toward the gate stack; a source layer disposed between the lower insulating layer and the gate stack; and a channel pattern including a connection part disposed between the source layer and the gate stack.

20 Claims, 20 Drawing Sheets

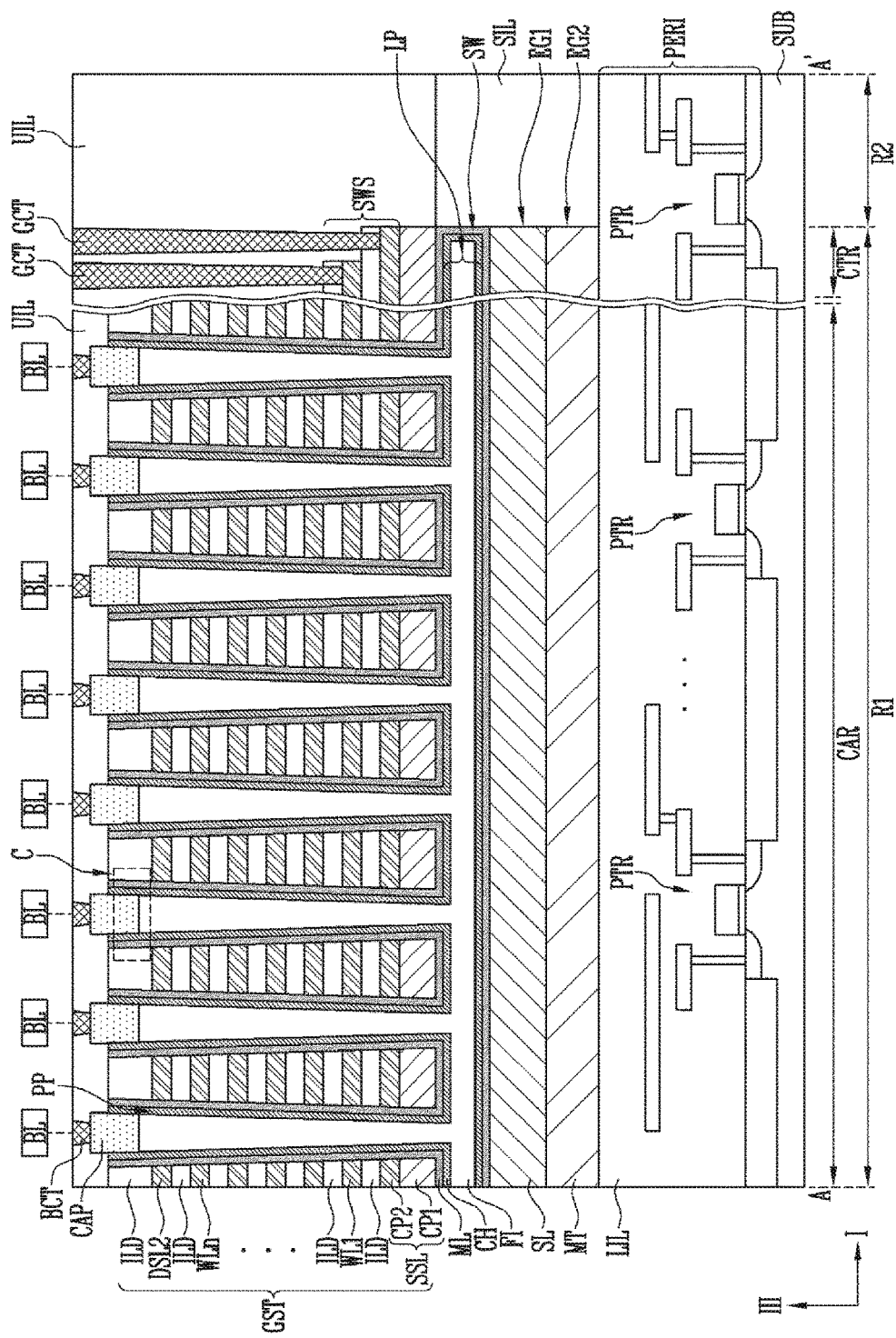

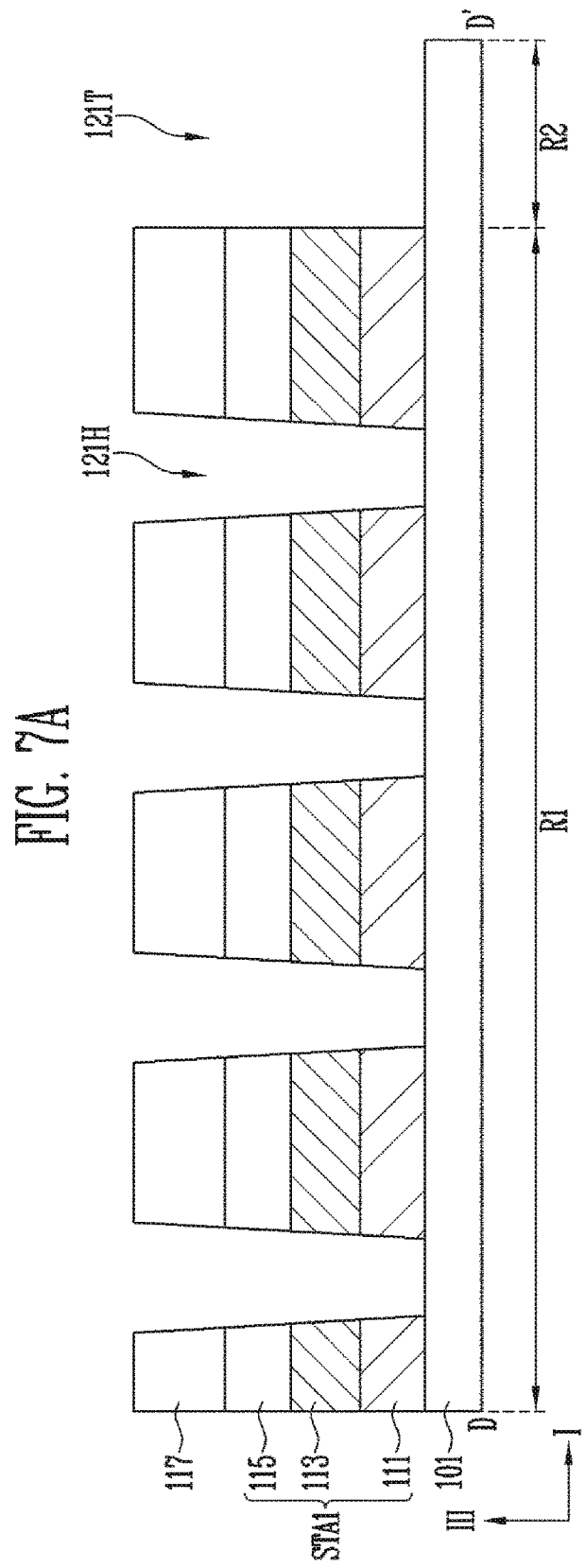

THREE-DIMENSIONAL SEMICONDUCTOR DEVICE

CROSS-REFERENCE TO RELATED APPLICATION

The present application claims priority under 35 U.S.C. § 119(a) to Korean patent application number 10-2017-0116715 filed on Sep. 12, 2017, the entire disclosure of which is incorporated herein by reference.

BACKGROUND

Field of Invention

Various embodiments of the present disclosure relate to a semiconductor device and a method of manufacturing the same, and more particularly, to a three-dimensional semiconductor device and a method of manufacturing the same.

Description of Related Art

A semiconductor device includes a plurality of memory cell transistors capable of storing data. The memory cell transistors may be coupled in series between select transistors, thus forming a memory string. Three-dimensional semiconductor devices embodied by stacking the gates of the memory cell transistors and the select transistors vertically on a substrate are well known. However, increasing the density of the devices, their operation speed and stability remain a challenge and are the subject of significant research.

SUMMARY

An embodiment of the present disclosure may provide for a semiconductor device including: a lower insulating layer; a gate stack disposed over the lower insulating layer; a plurality of supports extending from the lower insulating layer toward the gate stack; a source layer disposed between the lower insulating layer and the gate stack; and a channel pattern including a connection part disposed between the source layer and the gate stack.

An embodiment of the present disclosure may provide for a method of manufacturing a semiconductor device, including: forming a source layer and a sacrificial layer over a lower insulating layer including a first region and a second region; forming first openings and a second opening by etching the source layer and the sacrificial layer, the first openings exposing the first region of the lower insulating layer, the second opening exposing the second region of the lower insulating layer; filling the first openings and the second opening with insulating material; forming a stack including holes and disposed over the sacrificial layer; opening a horizontal space between the source layer and the stack by removing the sacrificial layer through the holes; and forming a channel layer in the holes and the horizontal space.

These and other features and advantages of the present invention will become apparent to those skilled in the art to which the present invention pertains from the following detailed description in reference to the accompanying drawings.

BRIEF DESCRIPTION OF THE DRAWINGS

FIG. 4 is a sectional view illustrating a semiconductor device according to an embodiment of the present disclosure.

DETAILED DESCRIPTION

Figure 1:
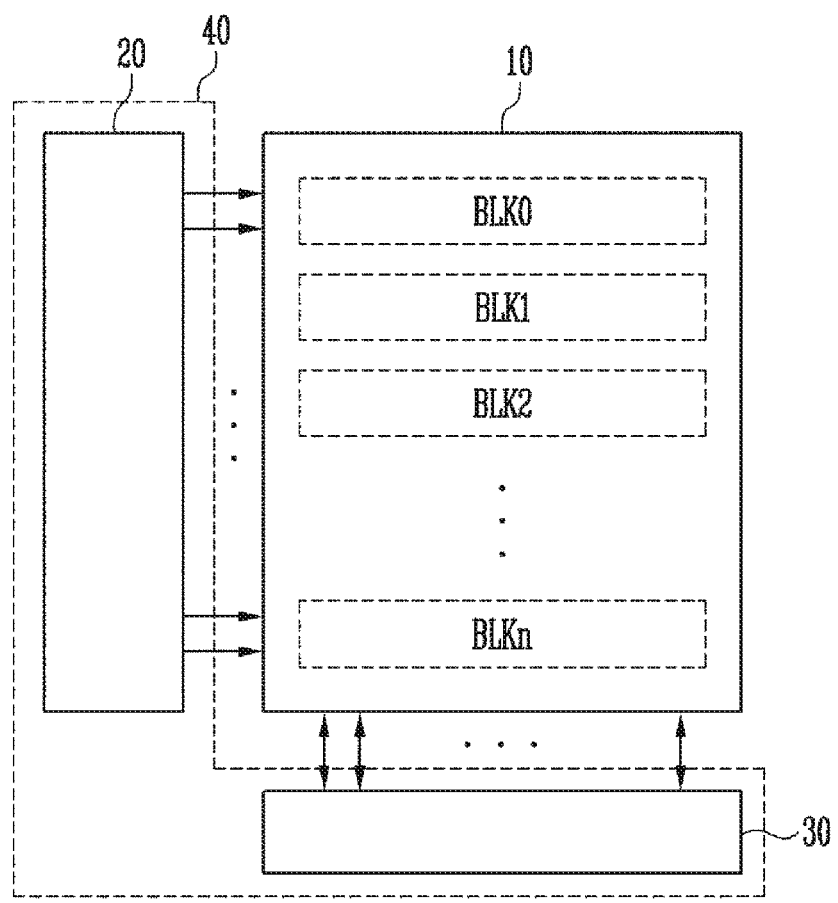
FIG. 1 is a block diagram illustrating a semiconductor device according to an embodiment of the present disclosure.

Example embodiments will now be described more fully hereinafter with reference to the accompanying drawings; however, we note that present invention may be embodied in different forms and should not be construed as limited to the embodiments set forth herein. Rather, these embodiments are provided so that this disclosure will be thorough and complete, and will fully convey the scope of exemplary embodiments of the present invention to those with ordinary skill in the art of the invention.

In the drawing figures, dimensions may be exaggerated for clarity of illustration. It will be understood that when an element is referred to as being "between" two elements, it can be the only element between the two elements, or one or more intervening elements may also be present.

Hereinafter, embodiments will be described with reference to the accompanying drawings. Embodiments are described herein with reference to cross-sectional illustrations that are schematic illustrations of embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but may include deviations in shapes that result, for example, from manufacturing. In the drawings, lengths and sizes of layers and regions may be exaggerated for clarity. Like reference numerals in the drawings denote like elements.

Terms such as 'first' and 'second' may be used to describe various components, but they should not limit the various components. Those terms are only used for the purpose of differentiating a component from other components. For example, a first component may be referred to as a second component, and a second component may be referred to as a first component and so forth without departing from the spirit and scope of the present disclosure. Furthermore, 'and/or' may include any one of or a combination of the components mentioned.

Furthermore, a singular form may include a plural from as long as it is not specifically mentioned in a sentence. Also, "include/comprise" or "including/comprising" used in the specification represents that one or more components, steps, operations, and elements may be exist in addition to any stated components, steps, operations, and elements.

It is further noted that unless defined otherwise, all the terms used in this specification including technical and scientific terms have the same meanings as would be generally understood by those skilled in the related art in view of the present specification. The terms defined in generally used dictionaries should be construed as having the same meanings as would be construed in the context of the related art, and unless clearly defined otherwise in this specification, should not be construed as having idealistic or overly formal meanings.

It is also noted that in this specification, "connected/coupled" refers to one component not only directly coupling another component but also indirectly coupling another component through an intermediate component. On the other hand, "directly connected/directly coupled" refers to one component directly coupling another component without an intermediate component.

Various embodiments of the present disclosure may provide a three-dimensional semiconductor device having high structural stability and capable of simplifying a manufacturing method, and a method of manufacturing the semiconductor device.

Throughout the disclosure, like reference numerals refer to like parts throughout the various figures and embodiments of the present invention.

In the following description, numerous specific details are set forth in order to provide a thorough understanding of the present invention. The present invention may be practiced without some or all of these specific details as it should be understood by those skilled in this art. In other instances, well-known process structures and/or processes have not been described in detail in order not to unnecessarily obscure the present invention.

It is also noted, that in some instances, as would be apparent to those skilled in the relevant art, a feature or element described in connection with one embodiment may be used singly or in combination with other features or elements of another embodiment, unless otherwise specifically indicated.

FIG. 1 is a block diagram illustrating a semiconductor device according to an embodiment of the present disclosure.

Referring to FIG. 1, the semiconductor device according to an embodiment of the present disclosure may include a memory cell array 10 and a peripheral circuit 40.

The memory cell array 10 may include a plurality of memory blocks BLK0 to BLKn. Each of the memory blocks BLK0 to BLKn may include a plurality of memory strings. Each memory string may include channel pattern in the form of a pillar which is coupled between a source layer and a bit line. A plurality of memory cell transistors and select transistors may be stacked along the pillar of the channel pattern. Each of the memory cell transistors may store one or more bits.

The peripheral circuit 40 may include a row decoder 20 and a page buffer 30.

The row decoder 20 may be electrically coupled with the memory cell array 10 through word lines and select lines that extend from gates of memory cell transistors and select transistors, respectively. The row decoder 20 may be configured to select a memory block depending on address information.

The page buffer 30 may be electrically coupled with the memory cell array 10 through bit lines. The page buffer 30 may be configured to selectively precharge the bit lines or sense the threshold voltage of memory cells using the potential of the bit lines.

The peripheral circuit 40 including the row decoder 20 and the page buffer 30 may be disposed in various layouts. For example, the peripheral circuit 40 may be disposed on one region of a substrate which does not overlap the memory cell array 10. In an embodiment, the peripheral circuit 40 may be disposed below the memory cell array 10 such that the peripheral circuit 40 overlaps the memory cell array 10.

Figure 2:
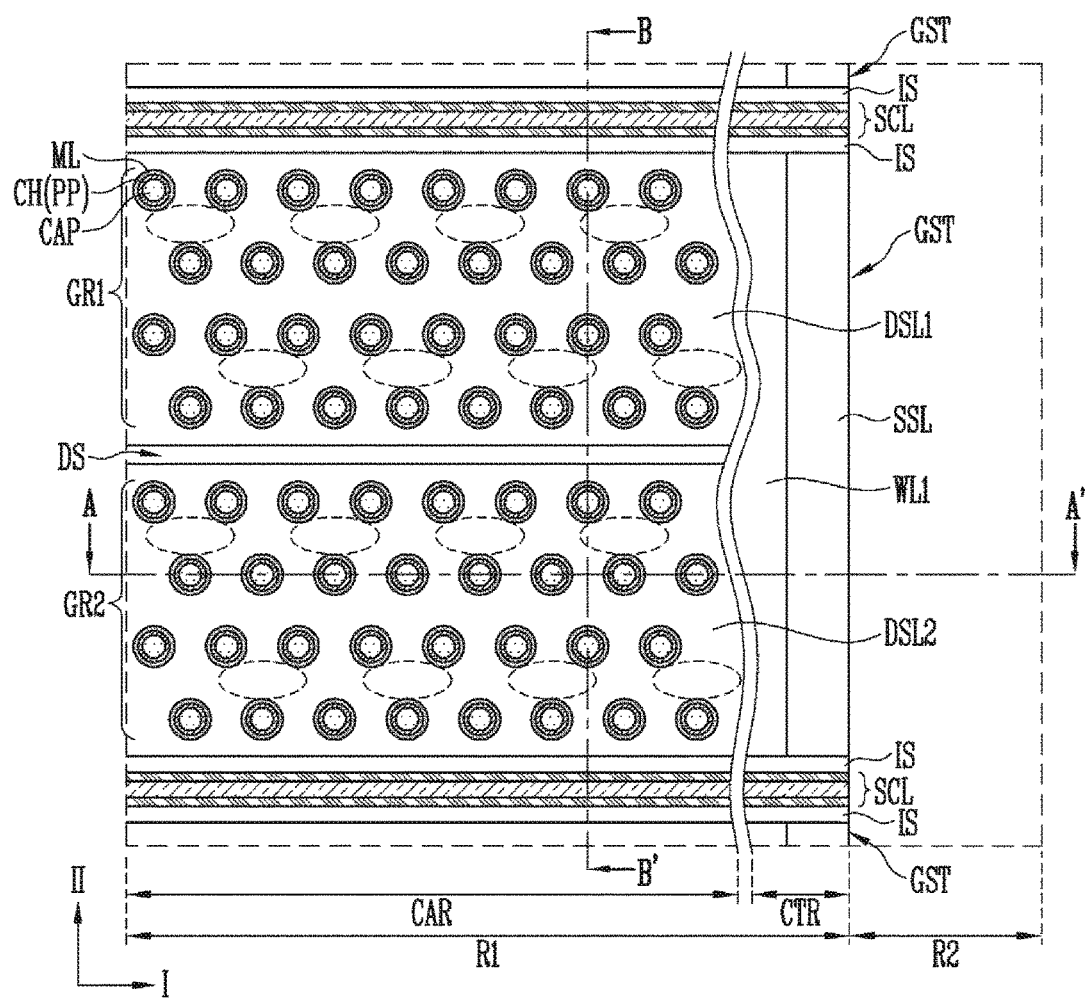
FIG. 2 is a plan view illustrating a semiconductor device according to an embodiment of the present disclosure.

FIG. 2 is a plan view illustrating a semiconductor device according to an embodiment of the present disclosure. In particular, FIG. 2 is a plan view illustrating one end of a memory block. In FIG. 2, a layout of supports IP which are disposed below a gate stack GST is indicated by a dotted line.

Referring to FIG. 2, the semiconductor device may include gate stacks GST, a channel pattern CH passing through each of the gate stacks GST, a multilayer memory layer ML enclosing an outer surface of the channel pattern CH, and a source contact line SCL disposed between the gate stacks GST. Although not shown in FIG. 2, a lower insulating layer and a source layer may be disposed below the gate stacks GST, and the source contact line SCL may come into contact with the source layer. The structure for each of the source layer and the lower insulating layer will be described with reference to FIG. 3A, 3B or 4.

As will be described later, the lower insulating layer includes a first region R1 and a second region R2, and the source layer extends onto the first region R1. The source layer does not extend onto the second region R2. The first region R1 may be defined as an overlapping region of the source layer, and the second region R2 may be defined as a non-overlapping region of the source layer.

Each gate stack GST may form a memory block. Each of the gate stacks GST may extend in a first direction I and a second direction II which intersect with each other. The source contact line SCL may be disposed between two adjacent gate stacks GST in the second direction II. An insulating spacer IS formed along the sidewalls of the gate stacks GST may insulate the source contact line SCL from the gate stacks GST. The source contact line SCL is coupled with the source layer. The structure of coupling the source layer with the source contact line SCL will be described with reference to FIG. 3A, 3B or 4.

Figure 3A:
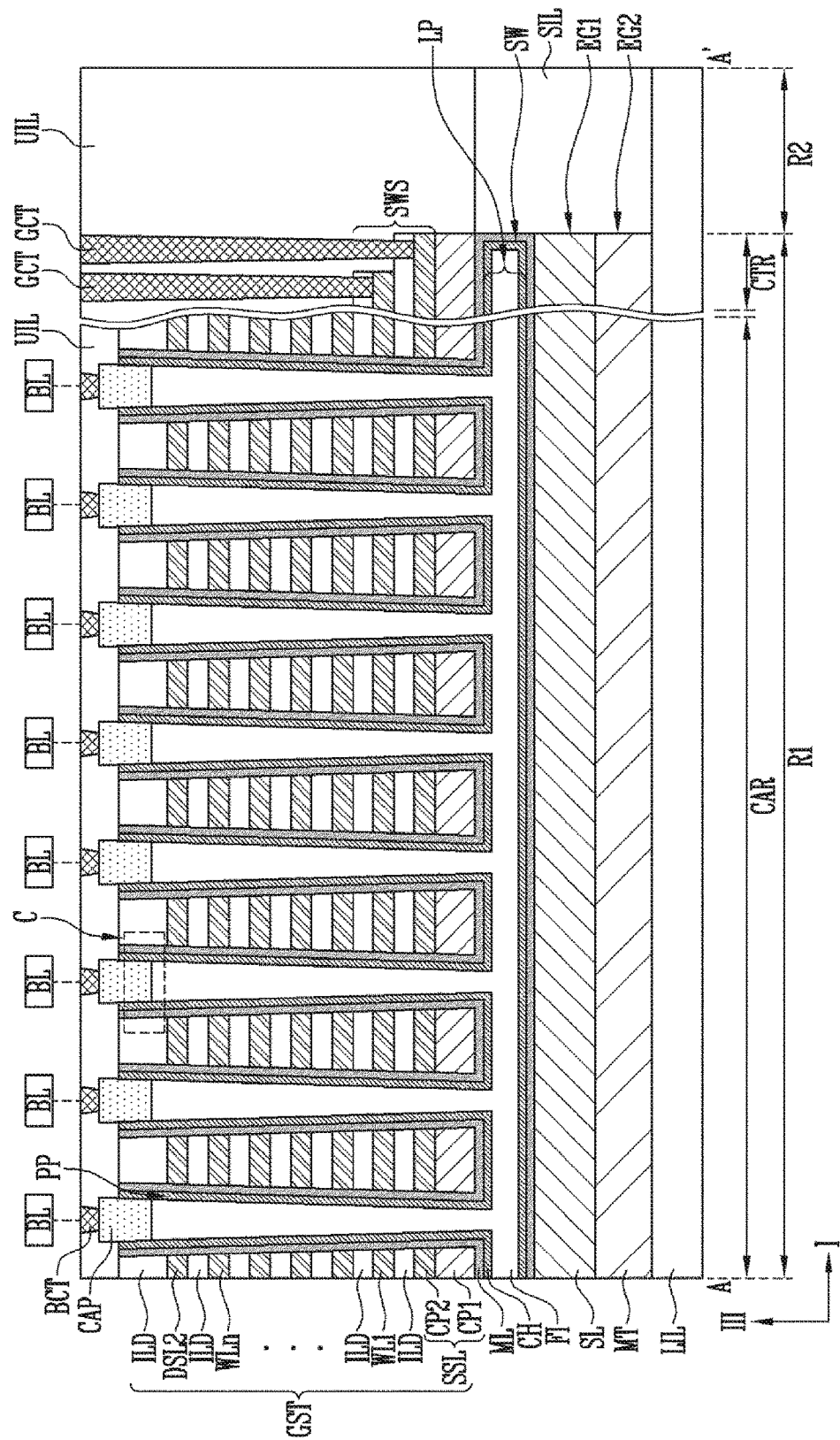
FIGS. 3A and 3B are sectional views illustrating a semiconductor device according to an embodiment of the present disclosure.
Figure 3B:
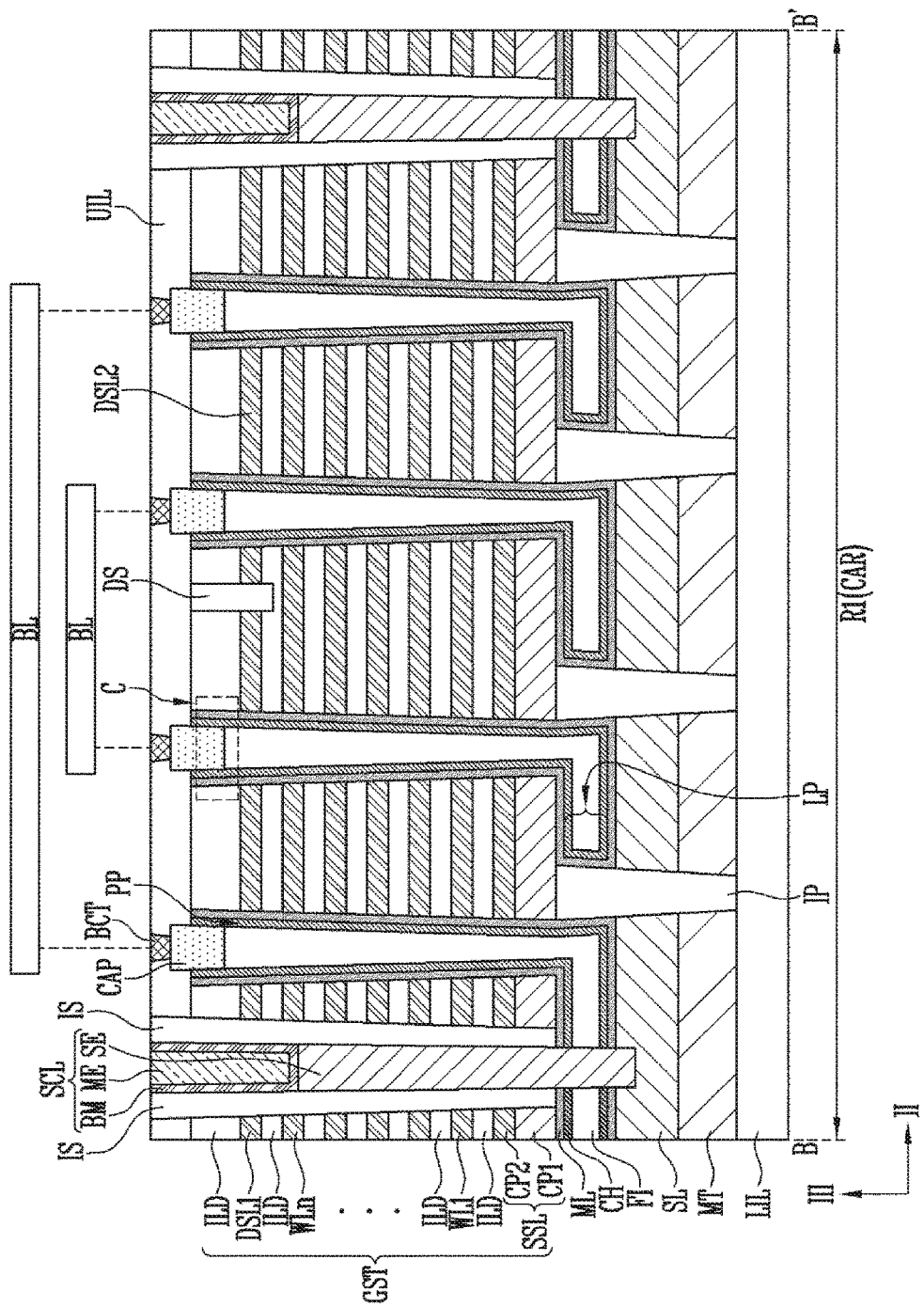

Each stack GST may include gate electrodes SSL, WL1 to WLn, DSL1 and DSL2. The gate electrodes SSL, WL1 to WLn, DSL1 and DSL2 are stacked on the first region R1 and are spaced apart from each other. The gate electrodes may include at least one source select line SSL, a plurality of word lines WL1 to WLn, and first and second drain select lines DSL1 and DSL2. In FIG. 2, for simplicity, there is illustrated a single word line WL1, however, a plurality of word lines WL1 to WLn are typically stacked on the source select line SSL as shown in FIGS. 3A and 3B. The source select line SSL may be disposed to have a single layered or two or more layered structure below the word lines WL1. The first drain select line DSL1 and the second drain select line DSL2 are disposed on the same plane, and are separated from each other in the second direction II by a drain separation insulating layer DS. The drain insulating layer DS may have the shape of an elongated bar extending in the first direction I when viewed from the top. The drain separation insulating layer DS may extend in a third direction III as to separate the first and second select lines DSL1 and DSL2 but may not pass through the word lines WL1 to WLn and the source select line SSL. The third direction III may refer to a direction intersecting perpendicular to a plane that extends along the first direction I and the second direction II as shown in FIGS. 3A, 3B and 4. The first drain select line DSL1 may be disposed to have a single layered or two or more layered structure over the word lines WL1 to WLn. The second drain select line DSL2 may be disposed to have a single layered or two or more layered structure over the word lines WL1 to WLn.

Each of the gate electrodes SSL, WL1 to WLn, DSL1 and DSL2 may include a cell array region CAR and a contact region CTR. Each of the gate electrodes SSL, WL1 to WLn, DSL1 and DSL2 may extend from the cell array region CAR toward the contact region CTR. The cell array region CAR and the contact region CTR may overlap the first region R1. The contact region CTR may extend to the boundary between the first region R1 and the second region R2, or extend onto one end of the second region R2 adjacent to the first region R1.

The gate electrodes SSL, WL1 to WLn, DSL1 and DSL2 may be patterned to form a stepped structure in the contact region CTR. Consequently, an end of each of the gate electrodes SSL, WL1 to WLn, DSL1 and DSL2 may be exposed through the stepped structure in the contact region CTR.

The channel pattern CH may include a plurality of pillars PP which are spaced apart in the cell array region CAR. To increase the disposition density of memory strings, the pillars PP may be arranged in a zigzag configuration as illustrated in FIG. 2, however, the invention is not limited in this way. Each pillar PP may be passing through the gate stack GST. The pillars PP may be divided into a first group GR1 and a second group GR2. The first group GR1 and the second group GR2 may be controlled in common by each of the source select line SSL and the word lines WL1 to WLn. The first group GR1 and the second group GR2 may be controlled by different drain select lines. For example, the first group GR1 may be controlled by the first drain select line DSL1, and the second group GR2 may be controlled by the second drain select line DSL2. Although not shown in FIG. 2, the channel pattern CH may include a connection part. The connection part may be coupled to the pillars PP and extend between the gate stack GST and the source layer. The structure of the connection part of the channel pattern CH is illustrated in FIGS. 3A, 3B and 4.

A portion of a central region of the channel pattern CH defined by each of the pillars PP may be filled with a capping pattern CAP. The pillar PP may be disposed without overlapping the supports IP, or, alternatively, may be disposed such that a part of the pillar PP overlaps a corresponding support IP. Each of the supports IP may be a pattern which passes through the source layer and is coupled to the lower insulating layer. The supports IP may be made of insulating material. The supports IP may be disposed in holes which are arranged in a zigzag configuration, as shown in FIG. 2. Although not shown in the drawings, each of the supports IP may have the form of a line disposed in a corresponding trench extending in one direction. The shape of each of the supports IP and the layout of the supports IP may be changed in various forms such that the shortest current path may be ensured in the channel pattern CH.

Hereinafter, the structure of the connection part of the channel pattern CH, the source layer, the lower insulating layer, the supports IP and so forth will be described in more detail with reference to sectional views.

FIGS. 3A and 3B are sectional views illustrating a semiconductor device according to an embodiment of the present disclosure. FIG. 4 is a sectional view illustrating a semiconductor device according to an embodiment of the present disclosure. FIG. 3A is a sectional view taken along line A-A' shown in FIG. 2. FIGS. 3B and 4 are sectional views taken along line B-B' shown in FIG. 2. FIGS. 3A, 3B and 4 schematically illustrate only a coupling relationship between the bit lines BL and the pillars PP of the channel pattern CH. The bit lines BL shown in FIGS. 3A, 3B and 4 may be implemented with various structures which embody the illustrated coupling relationship.

Referring to FIGS. 3A to 4, a lower insulating layer LIL may be divided into the first region R1 and the second region R2. A source layer SL may be disposed only on the first region R1 of the lower insulating layer LIL, and not on the second region R2. In detail, the source layer SL may not overlap the second region R2, and an edge EG1 of the source layer SL may be disposed on a boundary between the first region R1 and the second region R2. The source layer SL may be a silicon layer used as a source region. The source layer SL may be or include a doped silicon layer. In an embodiment, the source layer SL may have a stacked structure including an undoped silicon layer and the doped silicon layer. The source layer SL may include a first conductivity type dopant. The first conductivity type dopant may be an n-type dopant.

A metal layer MT may be further formed between the source layer SL and the lower insulating layer LIL. The metal layer MT may be formed of a low-resistance metal for reducing the resistance of the source layer SL. For example, the metal layer MT may include tungsten. Although not shown in the drawings, a doped semiconductor layer forming a well structure may be further disposed between the source layer SL and the metal layer MT. The doped semiconductor layer forming the well structure may include a second conductivity type dopant different from the first conductivity type dopant. The second conductivity type dopant may be a p-type dopant.

The gate stack GST may be disposed over the lower insulating layer LIL. As described in FIG. 2, the gate stack GST may include a cell array region CAR and a contact region CTR. The source layer SL is disposed between the gate stack GST and the lower insulating layer LIL. The source layer SL comes into contact with the lower insulating layer LIL, and is spaced apart from the gate stack GST.

The gate stack GST may include the gate electrodes SSL, WL1 to WLn, DSL1 and DSL2 and interlayer insulating layers ILD that are alternately stacked in the third direction III.

Each interlayer insulating layer ILD may be formed of an insulating material such as an oxide layer. Each interlayer insulating layer ILD may be disposed between two adjacent gate electrodes in the third direction III.

The gate electrodes SSL, WL1 to WLn, DSL1 and DSL2 may include a source select line SSL that is used as a gate electrode of a source select transistor, word lines WL1 to WLn that are used as gate electrodes of corresponding memory cell transistors, and first drain select line DSL1 and second drain select line DSL2 that are used as gate electrodes of corresponding drain select transistors.

Among the gate electrodes SSL, WL1 to WLn, DSL1 and DSL2, the source select line SSL that is disposed in a lowermost layer adjacent to the source layer SL may have a stacked structure including a first conductive layer CP1 and a second conductive layer CP2. Each of the first conductive layer CP1 and the second conductive layer CP2 may be formed of one selected from among various conductive materials. For example, each of the first conductive layer CP1 and the second conductive layer CP2 may be made of or include at least one of a doped silicon layer, a metal layer, a metal silicide layer and a barrier metal layer.

In an embodiment, the first conductive layer CP1 may be formed of a conductive material capable of functioning as an etching blocking layer, and the second conductive layer CP2 may be formed of conductive material suitable for forming a low-resistance line. In this case, the first conductive layer CP1 and the second conductive layer CP2 may be formed of different conductive materials. In more detail, the conductive material to be used for forming the first conductive layer CP1 may be selected taking into account an etching rate such that the first conductive layer CP1 can function as an etching stopper during a process of manufacturing the semiconductor device. For example, the first conductive layer CP1 may be formed of a doped silicon layer. The first conductive layer CP1 may include an n-type dopant. The first conductive layer CP1 may have a relatively larger thickness than the second conductive layer CP2 because it needs to have sufficient thickness to make it possible to function as an etching stopper during the manufacturing process. The thickness of the first conductive layer CP1 may be greater than that of each of the word lines WL1 to WLn in the third direction III. The second conductive layer CP2 may be formed of conductive material having resistance lower than that of the first conductive layer CP1. For example, the second conductive layer CP2 may be made of a tungsten layer. Although not shown, the source select line SSL may further include a barrier metal layer that extends between the second conductive layer CP2 and the interlayer insulating layer ILD, and between the second conductive layer CP2 and the channel pattern CH. One set or two or more sets of source select groups each including the interlayer insulating layer ILD and the second conductive layer CP2 may be disposed under the word lines WL1 to WLn.

The word lines WL1 to WLn are stacked on the source select line SSL and spaced apart from each other. Each of the word lines WL1 to WLn may be formed of the same conductive material as that of the second conductive layer CP2. Each of the word lines WL1 to WLn may further include a barrier metal layer.

The first drain select line DSL1 and the second drain select line DSL2 may be disposed over the word lines WL1 to WLn. The first drain select line DSL1 and the second drain select line DSL2 may be disposed on the same plane. Each of the first drain select line DSL1 and the second drain select line DSL2 may extend in the first direction I. The first drain select line DSL1 and the second drain select line DSL2 may be spaced apart from each other in the second direction II. The first drain select line DSL1 and the second drain select line DSL2 may be separated from each other by the drain separation insulating layer DS extending in the third direction III. The depth of the drain separation insulating layer DS may be controlled to prevent the drain separation insulating layer DS from passing through the source select line SSL and the word lines WL1 to WLn.

Each of the first drain select line DSL1 and the second drain select line DSL2 may be formed of the same conductive material as that of the second conductive layer CP2. Each of the first drain select line DSL1 and the second drain select line DSL2 may further include a barrier metal layer. One set or two or more sets of drain select groups each including the interlayer insulating layer ILD and the first and second drain select lines DSL1 and DSL2 that are disposed on the same plane on the interlayer insulating layer ILD may be disposed over the word lines WL1 to WLn.

Each of the gate electrodes SSL, WL1 to WLn, DSL1 and DSL2 may extend from the cell array region CAR toward the contact region CTR. The gate electrodes SSL, WL1 to WLn, DSL1 and DSL2 may be patterned to form a stepwise structure SWS on the contact region CTR. Due to the stepwise structure SWS, respective layers of the gate electrodes SSL, WL1 to WLn, DSL1 and DSL2 may be exposed. The respective layers of the gate electrodes SSL, WL1 to WLn, DSL1 and DSL2 that are exposed due to the stepwise structure SWS are coupled with respective gate contact plugs GCT so as to receive signals from the peripheral circuit. Each gate contact GCT may extend in the third direction III. The sidewall of the source select line SSL disposed in a lowermost layer of the stepwise structure SWS may be disposed on the same line as the edge EG1 of the source layer SL, or may be misaligned with the edge EG1 of the source layer SL.

To simplify the manufacturing process, the supports IP provided for supporting a space between the gate stack GST and the source layer SL may be formed by the same mask process as that of a source separation insulating layer SIL by which the source layer SL and the metal layer MT are cut. The source separation insulating layer SIL may be directly coupled to the second region R2 of the lower insulating layer LIL. Due to the characteristics of the process, the source separation insulating layer SIL and the supports IP may be formed of the same material.

The supports IP formed through the same mask process as that of the source separation insulating layer SIL may adhere to the first region R1 of the lower insulating layer LIL, and extend toward the gate stack GST. In other words, the supports IP may pass through the source layer SL and the metal layer MT that are disposed between the gate stack GST and the lower insulating layer LIL, and be directly coupled to the lower insulating layer LIL. The supports IP are formed of insulating material. For example, each of the supports IP may be formed of various oxide layers such as an aluminum oxide layer or a silicon oxide layer. Because the supports IP are formed of the same kind of insulating material as that of the lower insulating layer LIL, adhesion between the lower insulating layer LIL and the supports IP is greater than that between material layers made of different kinds of materials. Therefore, the supports IP that make contact with the lower insulating layer LIL may stably support the space between the gate stack GST and the source layer SL.

The source separation insulating layer SIL has a sidewall that is coplanar with the edge EG1 of the source layer SL and an edge EG2 of the metal layer MT. The source separation insulating layer SIL formed through the same mask process as that of the supports IP may also extend along the sidewall of a connection part LP of the channel pattern CH disposed below the gate stack GST.

The channel pattern CH extends in the first direction I and the second direction II along the space between the source layer SL and the gate stack GST, and protrudes in the third direction III to pass through the gate stack GST. In more detail, the channel pattern CH may be divided into the connection part LP and pillar PP. The connection part LP and the pillars PP may form an integrated channel pattern CH without having an interface therebetween.

The pillars PP extend from the connection part LP to pass through the gate stack GST. The pillars PP are parts enclosed by the gate stack GST, and extend along the respective inner surfaces of the holes passing through the gate stack GST. The pillars PP are disposed in the cell array region CAR.

The connection part LP is disposed in the space between the source layer SL and the gate stack GST, and encloses the supports IP. The connection part LP couples the pillars PP with each other. The connection part LP extends along the bottom of the gate stack GST, the sidewall of the source separation insulating layer SIL, the sidewalls of the supports IP, and an upper surface of the source layer SL. The connection part LP extends from the cell array region CAR toward the source separation insulating layer SIL. The connection part LP may have a sidewall SW facing the source separation insulating layer SIL.

The channel pattern CH may be enclosed by the multilayer memory layer ML. The multilayer memory layer ML extends along the outer surface of the channel pattern CH. In other words, the multilayer memory layer ML extends along surfaces of the pillars PP and the connection part LP. The channel pattern CH may be formed in such a way as to enclose a gap-fill insulating pattern FI.

The gap-fill insulating pattern FI is enclosed by the pillars PP, and extends to the space between the source layer SL and the gate stack GST and is enclosed by the connection part LP. The gap-fill insulating pattern FI may have a height less than that of the pillars PP. In this case, a capping pattern CAP may be disposed on top of each gap-fill insulating pattern FI. Each capping pattern CAP may be enclosed by an upper end of the associated pillar PP. Each of the capping patterns CAP may be formed of a semiconductor layer including a first conductivity type dopant. For example, each of the capping patterns CAP may be formed of a silicon layer doped with an n-type dopant. Each of the capping patterns CAP may be used as a drain junction.

The capping pattern CAP may protrude further than the gate stack GST. The capping pattern CAP may be covered with an upper insulating layer UIL. The upper insulating layer UIL may also be disposed on the gate stack GST to cover the stepwise structure SWS, and extend to cover the source separation insulating layer SIL. The upper insulating layer UIL is penetrated by the gate contact plug GCT. The gate contact plug GCT may further pass through the interlayer insulating layer ILD and come into contact with a gate electrode corresponding thereto.

Each of the supports IP has a side surface enclosed by the connection part LP. The multilayer memory layer ML extends between the connection part LP and the support IR Each of the pillars PP of the channel pattern CH may be coupled to a corresponding one of the bit lines BL. The bit lines BL may be coupled to the pillars PP of the channel pattern CH via bit contact plugs to BCT passing through the upper insulating layer UIL. Each bit contact plug BCT may be coupled to a corresponding capping pattern CAR Each of the bit lines BL may be coupled in common to one of the pillars PP passing through the first drain select line DSL1, and one of the pillars PP passing through the second drain select line DSL2. In FIGS. 3A, 3B and 4, for the sake of illustration, there is illustrated only the correspondence relationship between the bit lines BL and the bit contact plugs BCT. To couple the bit lines BL with the bit contact plugs BCT, pad patterns and contact structures may be further disposed therebetween, and the layout of the bit lines BL, the pad patterns and the contact structures may be designed in various ways.

The source contact line SCL may come into contact with the channel pattern CH and the source layer SL. The source contact line SCL extends from inside of the source layer SL in the third direction III such that the source contact line SCL faces a sidewall of the gate stack GST. The source contact line SCL is insulated from the gate electrodes SSL, WL1 to WLn, DSL1 and DSL2 of the gate stack GST by the insulating spacer IS which is disposed between the source contact line SCL and the gate stack GST.

The source contact line SCL comes into contact with the connection part LP of the channel pattern CH. The connection part LP of the channel pattern CH may extend to overlap a bottom surface of the insulating spacer IS. In other words, the connection part LP protrudes sideways further than the sidewall of the gate stacks GST, to overlap the bottom surface of the insulating spacer IS. The source contact line SCL may come into contact with the connection part LP in such a way as to pass through the connection part LP.

The source contact line SCL may protrude through the contact part LP of the channel pattern CH and partially into the source layer SL. The source contact line SCL may include a doped semiconductor layer SE, and a metal layer ME formed on the doped semiconductor layer SE.

The doped semiconductor layer SE may be a pattern coming into contact with the source layer SL and the connection part LP of the channel pattern CH, and have a height less than that of the gate stack GST. The doped semiconductor layer SE may include a first conductivity type dopant to supply the first conductivity type dopant to the source layer SL and the channel pattern CH. The first conductivity type dopant may be an n-type dopant. In more detail, the doped semiconductor layer SE may be formed of an n-type doped silicon layer.

The metal layer ME may be formed of low-resistance metal to reduce the resistance of the source contact line SCL. Although not shown in drawings, a metal silicide layer may be further disposed between the metal layer ME and the doped semiconductor layer SE. The metal layer ME may include tungsten and the like. The source contact line SCL may further include a barrier metal layer BM which extends along the interface between the metal layer ME and the insulating spacer IS and the interface between the doped semiconductor layer SE and the metal layer ME. The barrier metal layer BM may prevent metal diffusion, and may be made of or include a titanium nitride layer, a tungsten nitride layer, a tantalum nitride layer or the like.

The first conductivity type dopant may be distributed in a portion of the connection part LP of the channel pattern CH that is adjacent to the source contact line SCL. The portion of the connection part LP of the channel pattern CH including the first conductivity type dopant may be used as a source junction.

Figure 5:
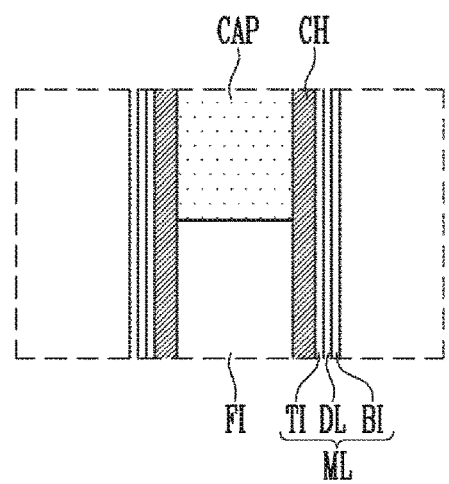
FIG. 5 is an enlarged view of region C shown in FIGS. 3A, 3B or 4.

As described in FIG. 4, the lower insulating layer LIL may be disposed over a substrate SUB to cover driving transistors PTR which form a peripheral circuit PERI. The driving transistors PTR may be disposed under the lower insulating layer LIL such that the driving transistors PTR overlap at least one of the first region R1 and the second region R2 of the lower insulating layer LIL. FIG. 5 is an enlarged view of region C shown in FIGS. 3A, 3B or 4.

Referring to FIG. 5, the channel pattern CH may have an inner surface facing the capping pattern CAP and the gap-fill insulating pattern FI, and an outer surface enclosed by the multilayer memory layer ML.

The multilayer memory layer ML may include a tunnel insulating layer TI enclosing the channel pattern CH, a data storage layer DL enclosing the tunnel insulating layer TI, and a blocking insulating layer BI enclosing the data storage layer DL. The data storage layer DL may store data to be changed using the Fowler-Nordheim tunneling caused by a voltage difference between the word lines WL1 to WLn shown in FIGS. 2, 3A, 3B and 4. For this operation, the data storage layer DL may be formed of various materials, for example, a nitride layer capable of trapping charges. In addition, the data storage layer DL may include silicon, phase-change material, nanodots, etc. The blocking insulating layer BI may include an oxide layer capable of blocking charges. The tunnel insulating layer TI may be formed of a silicon oxide layer.

The channel pattern CH may be formed of a semiconductor layer, for example, a silicon layer. Hereinafter, a method of manufacturing the semiconductor device according to an embodiment of the present disclosure will be described with reference to FIGS. 6 to 11E.

Figure 6:
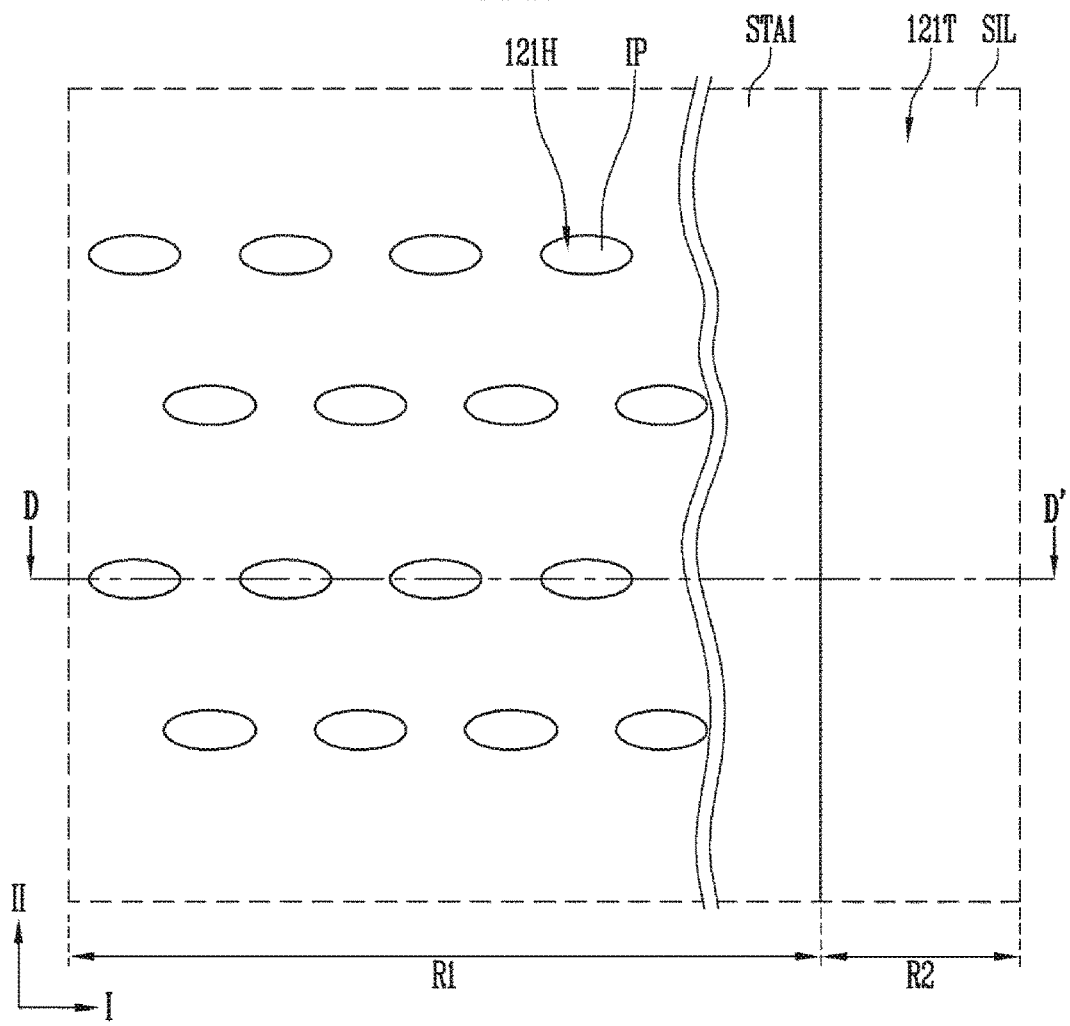
FIGS. 6 to 11E are sectional views illustrating a method of manufacturing a semiconductor device according to an embodiment of the present disclosure.

FIG. 6 is a plan view illustrating a process result of a step of forming the supports IP and the source separation insulating layer SIL.

Referring to FIG. 6, the supports IP and the source separation insulating layer SIL may be formed using a mask process for patterning a first stack STA1. The supports IP may be respectively disposed in first openings 121H passing through the first stack STA1. The supports IP or the first openings 121H may be spaced apart in a zigzag arrangement. The source separation insulating layer SIL may be disposed in a second opening 121T which defines an edge of the first stack STA1.

The first stack STA1, the supports IP and the source separation insulating layer SIL may be formed on the lower insulating layer. The lower insulating layer may be formed to cover the peripheral circuit PERI after the driving transistors PTR forming the peripheral circuit PERI shown in FIG. 4 have been provided on the substrate SUB. Hereinafter, a process of forming the first stack STA1, the supports IP and the source separation insulating layer SIL that are disposed on the lower insulating layer will be described in more detail with reference to FIGS. 7A to 7C.

Figure 7B:
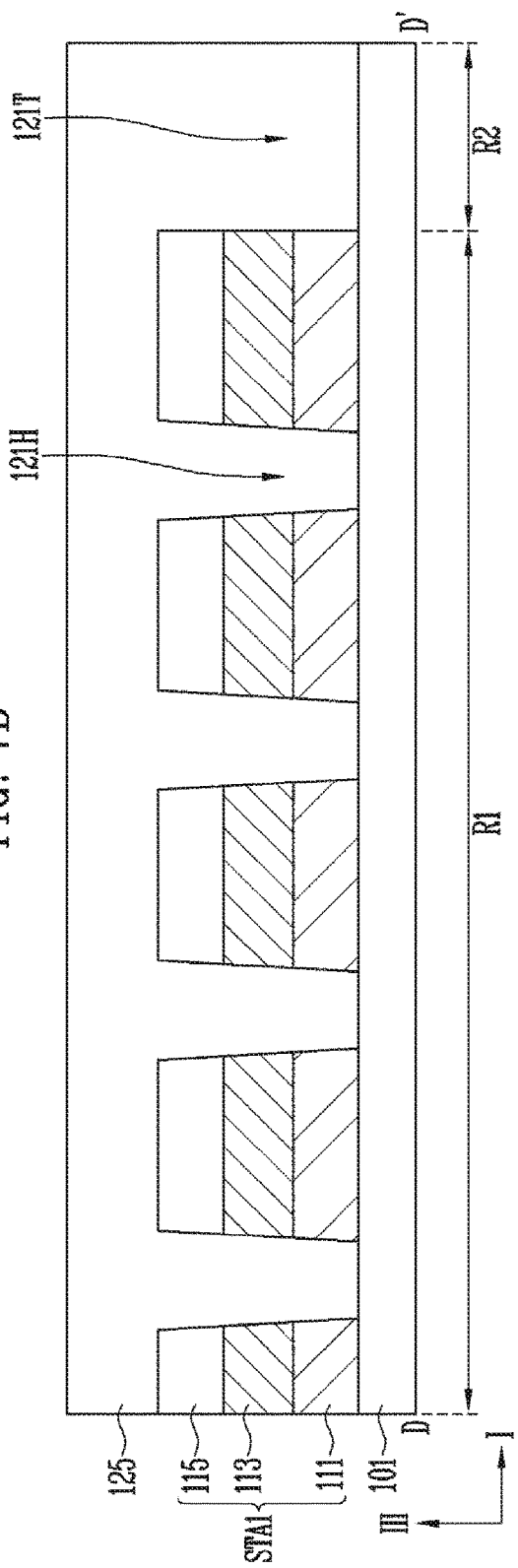
Figure 7C:
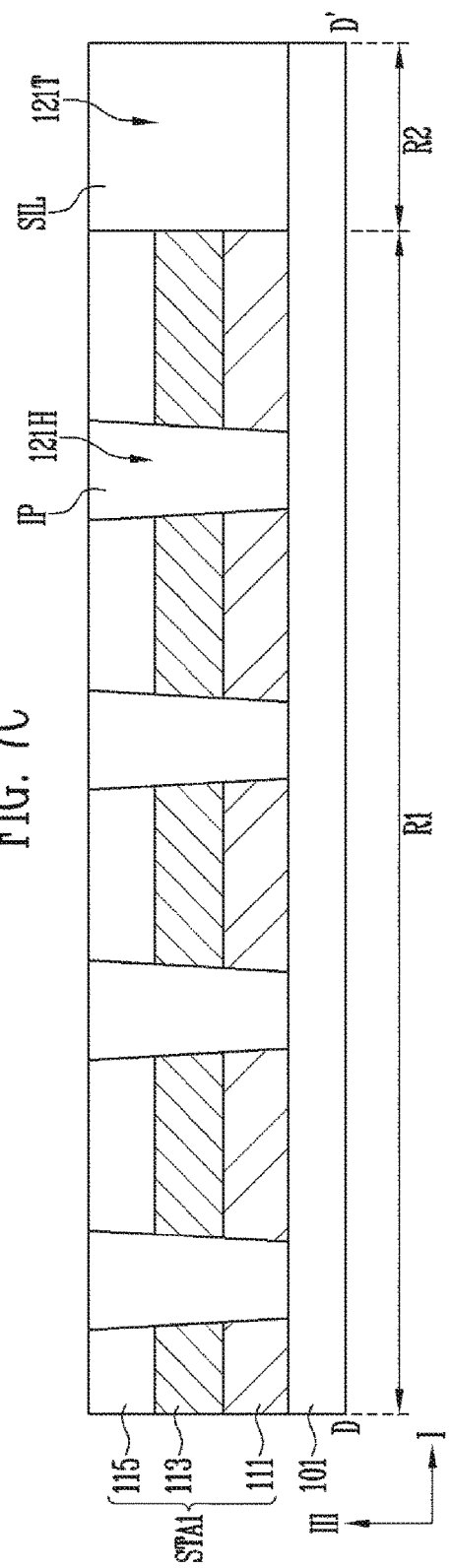

FIGS. 7A to 7C are sectional views illustrating the process of forming the supports IP and the source separation insulating layer SIL that are shown in FIG. 6. FIGS. 7A to 7C show sectional views taken along line D-D' of FIG. 6 at various steps of the process.

Referring to FIG. 7A, a metal layer 111, a source layer 113 and a sacrificial layer 115 are successively stacked on a lower insulating layer 101 which includes the first region R1 and the second region R2 extending from the first region R1. The metal layer 111 may be formed of low-resistance metal such as tungsten to form a low-resistance line. The source layer 113 may be formed of an n-type doped silicon layer. The sacrificial layer 115 may be formed of a material layer having an etching rate different from that of the source layer 113. In more detail, the sacrificial layer 115 may be formed of a material layer which minimizes loss of the source layer 113 and is selectively etchable during an etching process of the sacrificial layer 115. For example, the sacrificial layer 115 may be formed of a titanium nitride layer TiN.

Subsequently, a mask pattern 117 may be formed on the sacrificial layer 115. The mask pattern 117 may be a photoresist pattern formed through a photolithography process. The mask pattern 117 may include openings that define a region in which the second openings 121T is to be formed and regions in which the first openings 121H are to be formed.

The first stack STA1 may then be formed by etching the sacrificial layer 115, the source layer 113 and the metal layer 111 through an etching process using the mask pattern 117 as an etch barrier. The first stack STA1 extends to overlap the first region R1 of the lower insulating layer 101. The first stack STA1 is cut by the second opening 121T that is defined by removing the sacrificial layer 115, the source layer 113 and the metal layer 111 in the second region R2 of the lower insulating layer 101.

The second opening 121T may have a trench shape extending to expose the entirety of the second region R2 of the lower insulating layer 101 from a boundary between the first region R1 and the second region R2 of the lower insulating layer 101. In other words, the second region R2 of the lower insulating layer 101 is exposed and is not covered with the first stack STA1.

The first stack STA1 is penetrated by the first openings 121H which expose the first region R1 of the lower insulating layer 101. Each of the first openings 121H may be formed in a hole shape, as shown in the drawings. Although not shown, each of the first openings 121H may have a line shape extending in one direction when viewed from the top.

Referring to FIG. 7B, after the mask pattern 117 described in FIG. 7A has been removed, an insulating layer 125 is formed such that the first openings 121H and the second opening 121T are completely filled therewith. The insulating layer 125 may be formed of the same kind of material as that of the lower insulating layer 101 to increase adhesion between the lower insulating layer 101 and the insulating layer 125. For example, the insulating layer 125 may be an oxide layer.

Referring to FIG. 7C, the sacrificial layer 115 is exposed by planarizing the surface of the insulating layer 125 shown in FIG. 7B. Consequently, the insulating layer 125 remains as the supports IP inside the respective first openings 121H, and also remains as the source separation insulating layer SIL inside the second opening 121T.

As described in FIGS. 7A to 7C, the supports IP are formed through the same mask process used for forming the source separation insulating layer SIL. Therefore, according to the described embodiment of the present disclosure, the supports IP may be formed without an additional mask process for manufacturing the semiconductor device. In addition, because the supports IP come into contact with the lower insulating layer 101, the supports IP may more reliably adhere to the lower insulating layer 101, compared the case where the supports IP come into contact with a conductive material or a semiconductor material.

Figure 8:
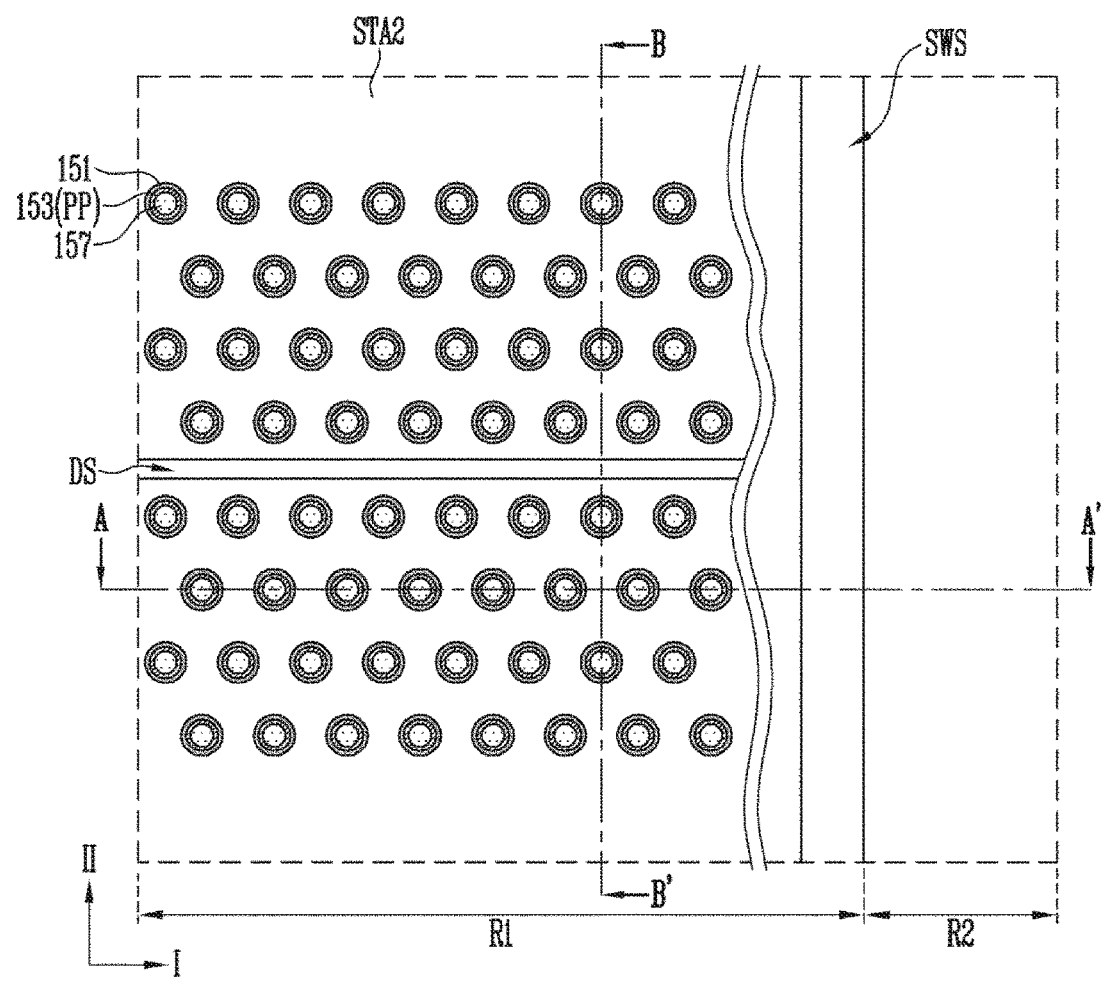

FIG. 8 is a plan view illustrating a process result provided through the steps of forming a stepwise structure SWS and a channel layer 153.

Referring to FIG. 8, the stepwise structure SWS may be formed by patterning a second stack STA2 which includes a plurality of layers. The stepwise structure SWS may be defined on an end of the second stack STA2, and be disposed on a boundary between the first region R1 and the second region R2 or be disposed adjacent to the boundary between the first region R1 and the second region R2.

Some of the layers forming the second stack STA2 may be penetrated by the drain separation insulating layer DS. The second stack STA2 is penetrated by the channel layer 153 enclosed by a multilayer memory layer 151. FIG. 8 illustrates a plurality of pillars PP of the channel layer 153. Each of the pillars PP may be formed to enclose a corresponding capping pattern 157. The pillars PP may be arranged in a zigzag manner to improve the degree of integration of the semiconductor device. The pillars PP may be arranged in a plurality of rows on opposite sides of the drain separation insulating layer DS.

Figure 9A:
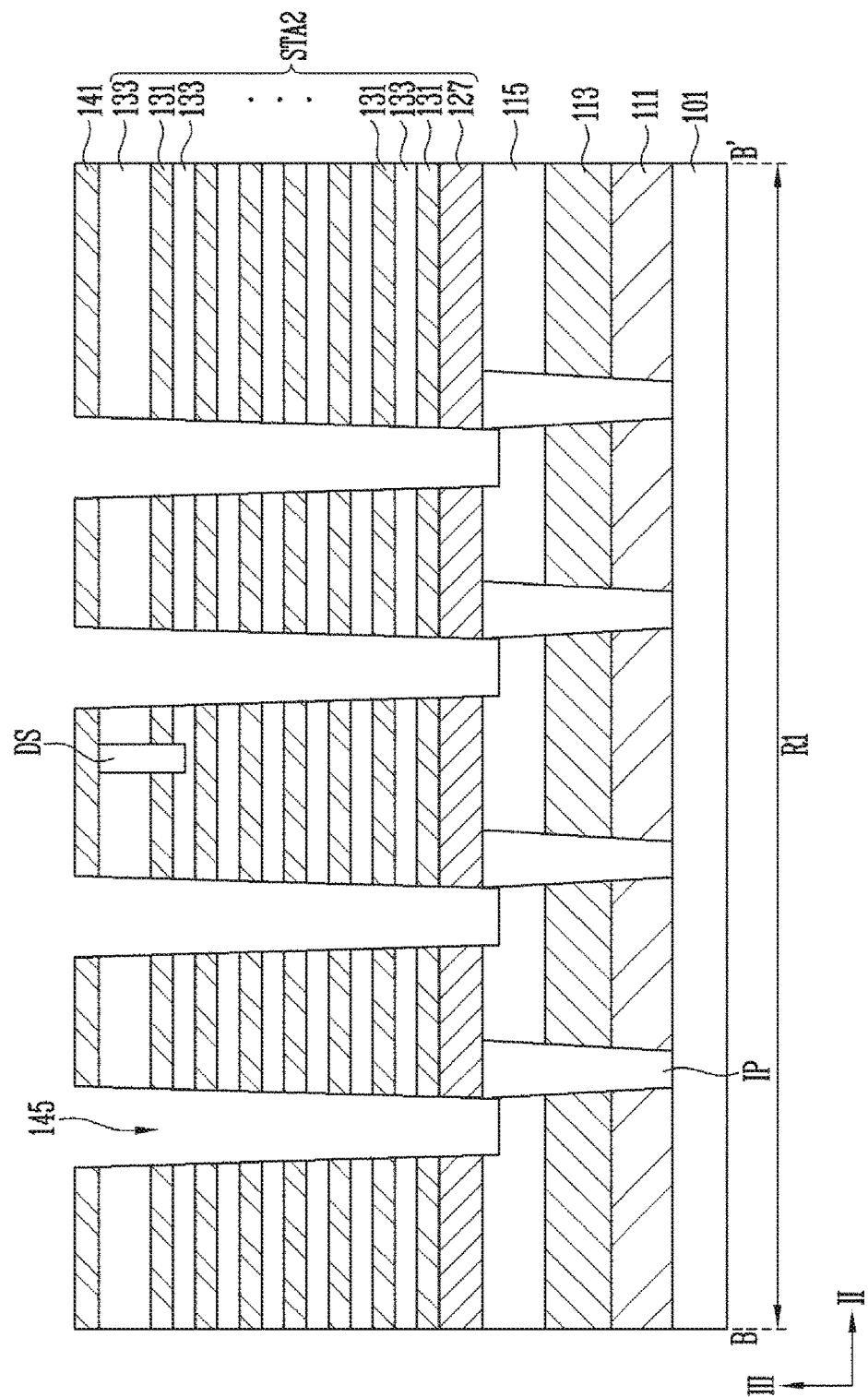
Figure 9B:
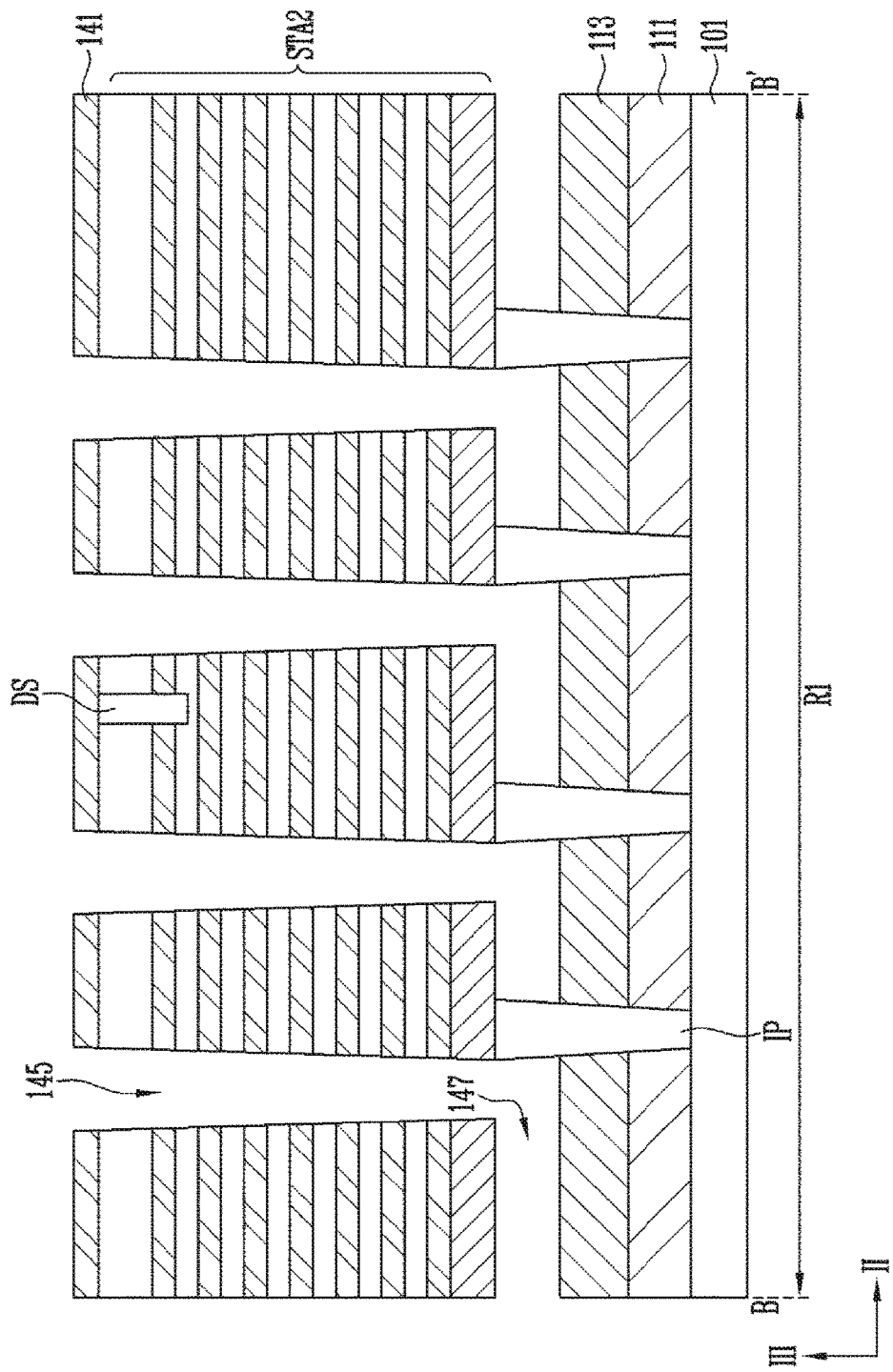
Figure 9C:
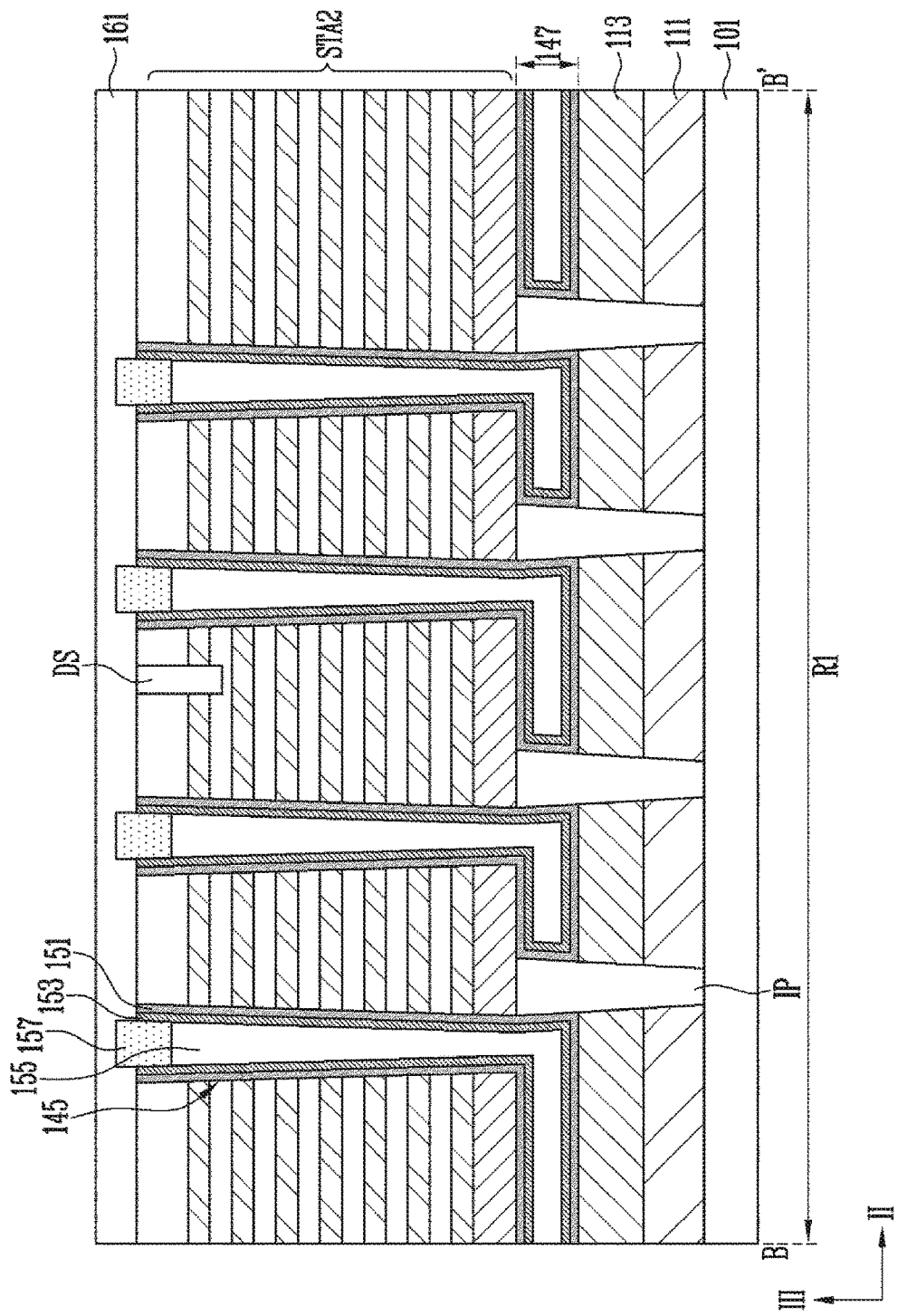
Figure 10:
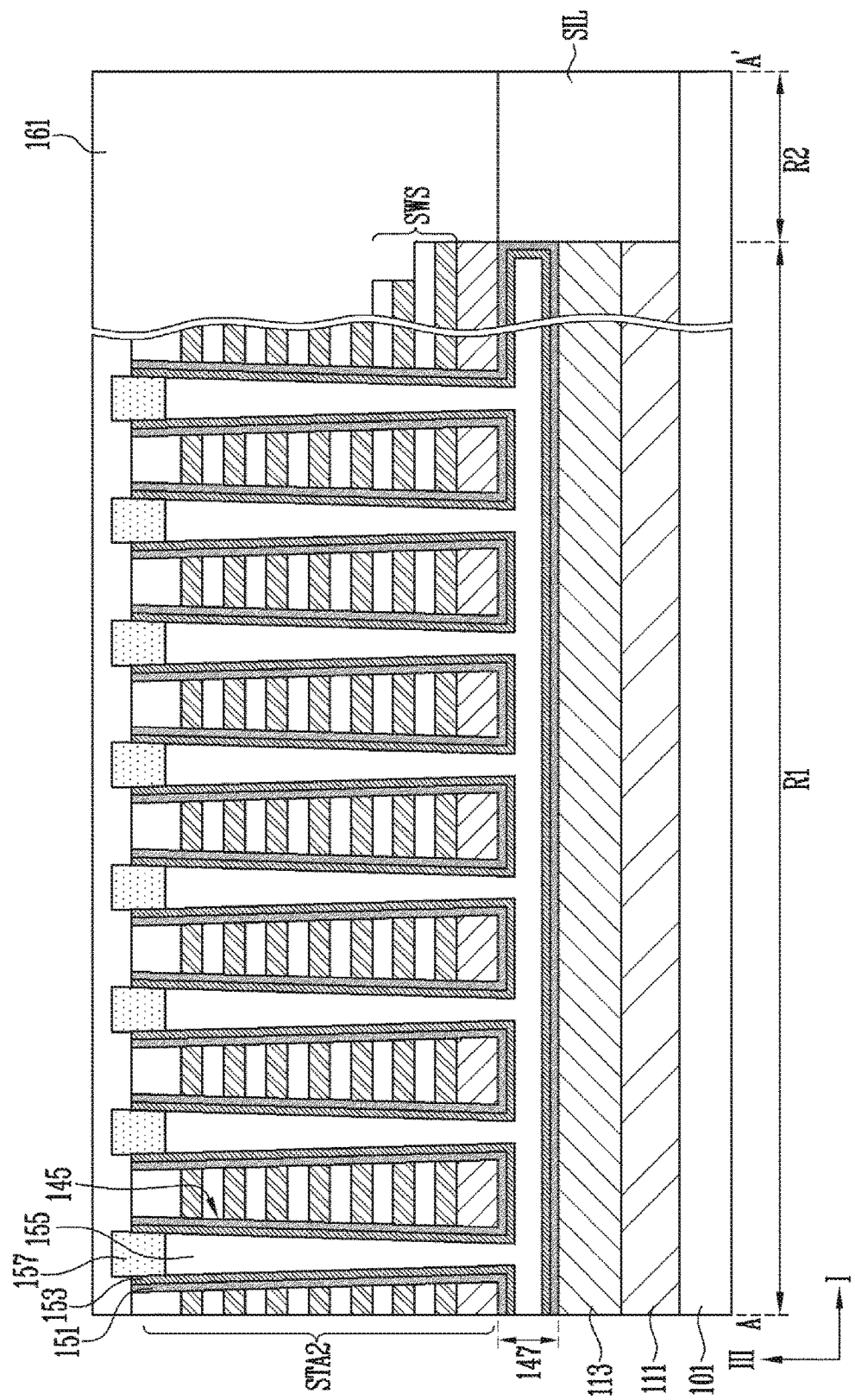

FIGS. 9A to 9C and 10 are sectional views illustrating a process of forming the stepwise structure SWS and the channel layer 153 that are shown in FIG. 8. FIGS. 9A to 9C show, sectional views taken along line B-B' of FIG. 8 at various steps of the manufacturing process. FIG. 10 is a sectional view taken along line A-A' shown in FIG. 8.

Referring to FIG. 9A, the second stack STA2 may be formed on the sacrificial layer 115. The second stack STA2 may include a first conductive layer 127 stacked on the sacrificial layer 115, and a plurality of first and second material layers 131 and 133 that are alternately stacked on the first conductive layer 127. The first material layers 131 define regions in which gate electrodes are to be disposed, and the second material layers 133 define regions in which interlayer insulating layers are to be disposed.

The first conductive layer 127 may be formed of material different from those of the first material layers 131 and the second material layers 133. In more detail, the first conductive layer 127 may be formed of material which may be used not only as a gate electrode, but also as an etch stop layer during a following process of forming a slit. For example, the first conductive layer 127 may be formed of a doped silicon layer. In more detail, the first conductive layer 127 may be formed of a doped silicon layer including an n-type dopant.

The second material layers 133 may be formed of material different from that of the first material layers 131. The first material layers 131 may be made of sacrificial insulating material, and the second material layers 133 may be made of insulating material for interlayer insulating layers. In detail, each first material layer 131 may be formed of a silicon nitride layer, and each second material layer 133 may be formed of a silicon oxide layer.

Although not shown in the drawings, the first material layers 131 may be formed of second conductive layers for the gate electrodes SSL, WL1 to WLn, DSL1 and DSL2 shown in FIGS. 2 to 4, and the second material layers 133 may be formed of insulating material for interlayer insulating layers.

After the second stack STA2 has been formed, the drain separation insulating layer DS may pass through some of the first material layers 131 and the second material layers 133. The drain separation insulating layer DS may be formed to separate first and second drain select lines from each other. The depth of the drain separation insulating layer DS may be changed in various ways depending on designs. The drain separation insulating layer DS may be omitted, if needed.

Subsequently, a mask pattern 141 may be formed on the second stack STA2. The mask pattern 141 may be patterned through a photolithography process. The mask pattern 141 may include openings that expose regions in which holes 145 are to be defined. Thereafter, the holes 145 exposing the sacrificial layer 115 may be formed by etching the second stack STA2 through an etching process using the mask pattern 141 as an etch barrier. In the case where the sacrificial layer 115 is made of material including a metal such as titanium nitride TiN, the bottom of each hole 145 may be formed to have a relatively large width using a large difference in etching rate between the second stack STA2 and the sacrificial layer 115.

Central axes of the holes 145 may be misaligned with those of the supports IR For example, the holes 145 may be disposed not to overlap the supports IP.

Referring to FIG. 9B, the sacrificial layer 115 shown in FIG. 9A is removed through the holes 145. Consequently, a horizontal space 147 opens in a region in which the sacrificial layer 115 has been removed. The horizontal space 147 is coupled to the holes 145, and is defined between the source layer 113 and the second stack STA2.

Upper ends of the supports IP may be exposed by the horizontal space 147. The supports IP may support the second stack STA2 such that the gap of the horizontal space 147 is maintained. Because the supports IP adhere to the lower insulating layer 101 with high adhesion, the supports may reliably maintain the horizontal space 147.

Referring to FIGS. 9C and 10, the multilayer memory layer 151 may be formed extending along the surfaces of the holes 145, the surface of the horizontal space 147 and the exposed side surfaces of the supports IP. The step of forming the multilayer memory layer 151 may include first forming a blocking insulating layer, then forming a data storage layer on the blocking insulating layer, and then forming a tunnel insulating layer on the data storage layer. The structure and material of each of the blocking insulating layer, the data storage layer and the tunnel insulating layer are the same as those described with reference to FIG. 5.

Thereafter, the channel layer 153 may be formed on the surface of the multilayer memory layer 151 and extend along the surfaces of the holes 145, the surface of the horizontal space 147, and the side surfaces of the supports IR The channel layer 153 may be enclosed by the multilayer memory layer 151.

The channel layer 153 may be formed of a semiconductor layer. For instance, the channel layer 153 may be formed by depositing a silicon layer. The channel layer 153 may be formed to be a single, continuous, integrated layer without any internal interface.

A central region of each hole 145 defined by the channel layer 153 and a central region of the horizontal space 147 may be filled with a gap-fill insulating layer 155. The gap-fill insulating layer 155 may be enclosed by the channel layer 153. The step of forming the gap-fill insulating layer 155 may include filling the holes 145 and the horizontal space 147 with an insulating material. The insulating material layer may be selected from among various materials. For example, the insulating material may be formed by using a material having the fluidity. In this case, it is easy to fill the holes 145 and the horizontal space 147. In an embodiment, a polysilazane (PSZ) may be used as the material layer having a sufficient fluidity for filling the holes 145 and the horizontal space 147. After the PSZ has filled the holes and the horizontal space it may be then hardened into a solid material by annealing.

The step of forming the gap-fill insulating layer 155 may further include the step of recessing a portion of the gap-fill insulating layer 155 so that the height of the gap-fill insulating layer 155 is less than that of the channel layer 153. Consequently, the gap-fill insulating layer 155 is enclosed by the channel layer 153, and has a height less than that of the channel layer 153. A central region of the channel layer 153 that is exposed on the gap-fill insulating layer 155 may be filled with the capping pattern 157. The capping pattern 157 may be formed of a doped silicon layer including a first conductivity type dopant.

Subsequently, the stepwise structure SWS may be formed by patterning the second stack STA2. Thereafter, the mask pattern is removed. The source separation insulating layer SIL may be exposed by the stepwise structure SWS.

Thereafter, an upper insulating layer 161 may be formed on the second stack STA2 to cover the capping pattern 157 and the stepwise structure SWS. A surface of the upper insulating layer 161 may be planarized. The upper insulating layer 161 may extend to cover an upper surface of the source separation insulating layer SIL.

FIGS. 11A to 11E show sectional views illustrating various steps of the process of forming a source contact line.

Figure 11A:
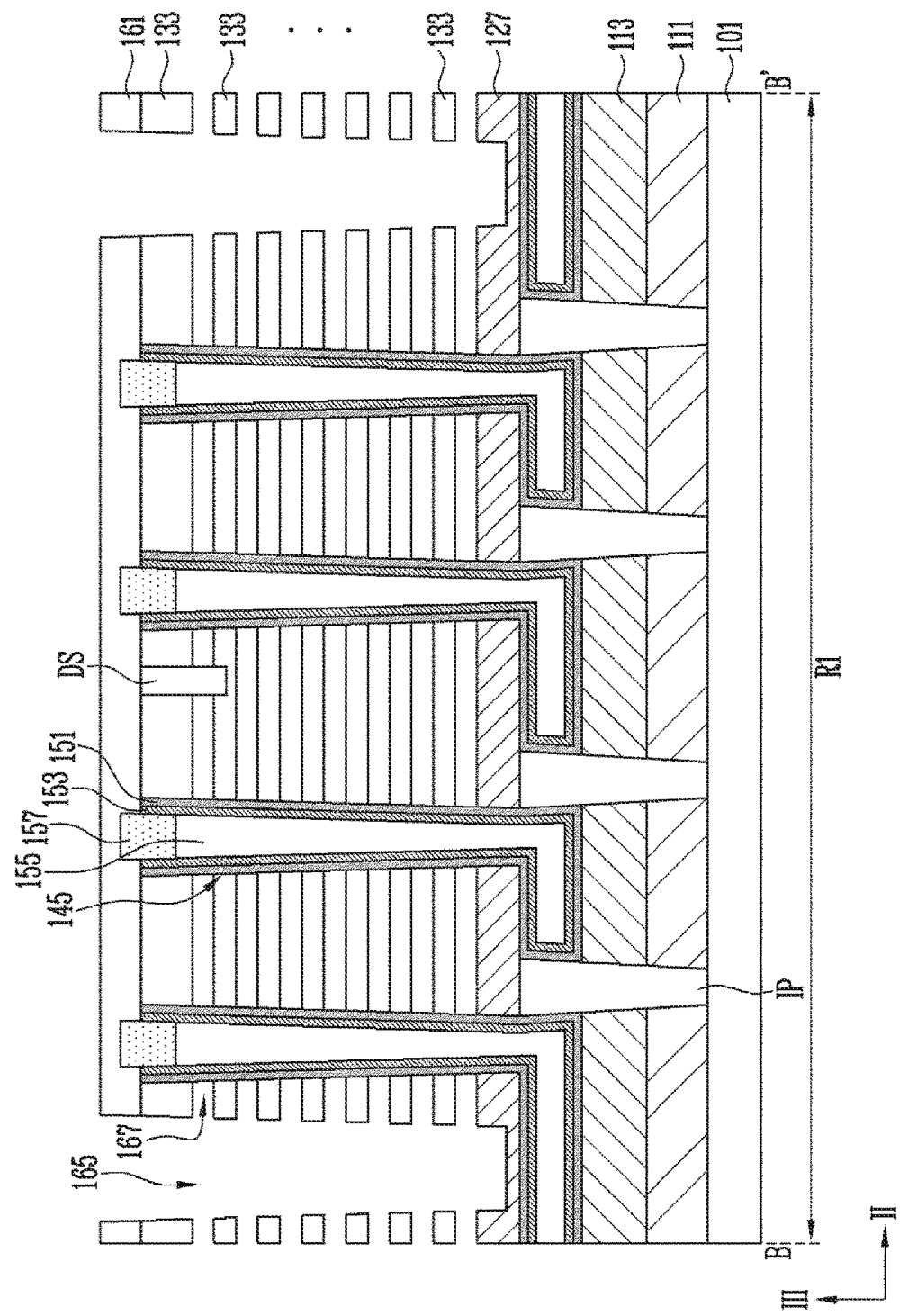

Referring to FIG. 11A, a first through portion 165 is formed by etching the upper insulating layer 161 and the second stack STA2 described with reference to FIGS. 8, 9C and 10 through an etching process that stops when the first conductive layer 127 is exposed. The first conductive layer 127 has been formed of material having an etch rate different from that of the first material layers 131 and the second material layers 133 of the second stack STA2. As a result, the depth of the first through portion 165 may be easily controlled such that the first through portion 165 passes through the first material layers 131 and the second material layers 133 without passing through the first conductive layer 127. To form the first through portion 165, a mask pattern (not shown) that opens a region in which the first through portion 165 is to be formed may be formed on the upper insulating layer 161. The mask pattern may be removed after the first through portion 165 has been formed.

In the case where the first material layers 131 are formed of sacrificial insulating material, the first material layers 131 may be removed through the first through portion 165. Consequently, gate regions 167 may open between the second material layers 133, and between the first conductive layer 127 and the second material layer 133 adjacent thereto.

Figure 11B:
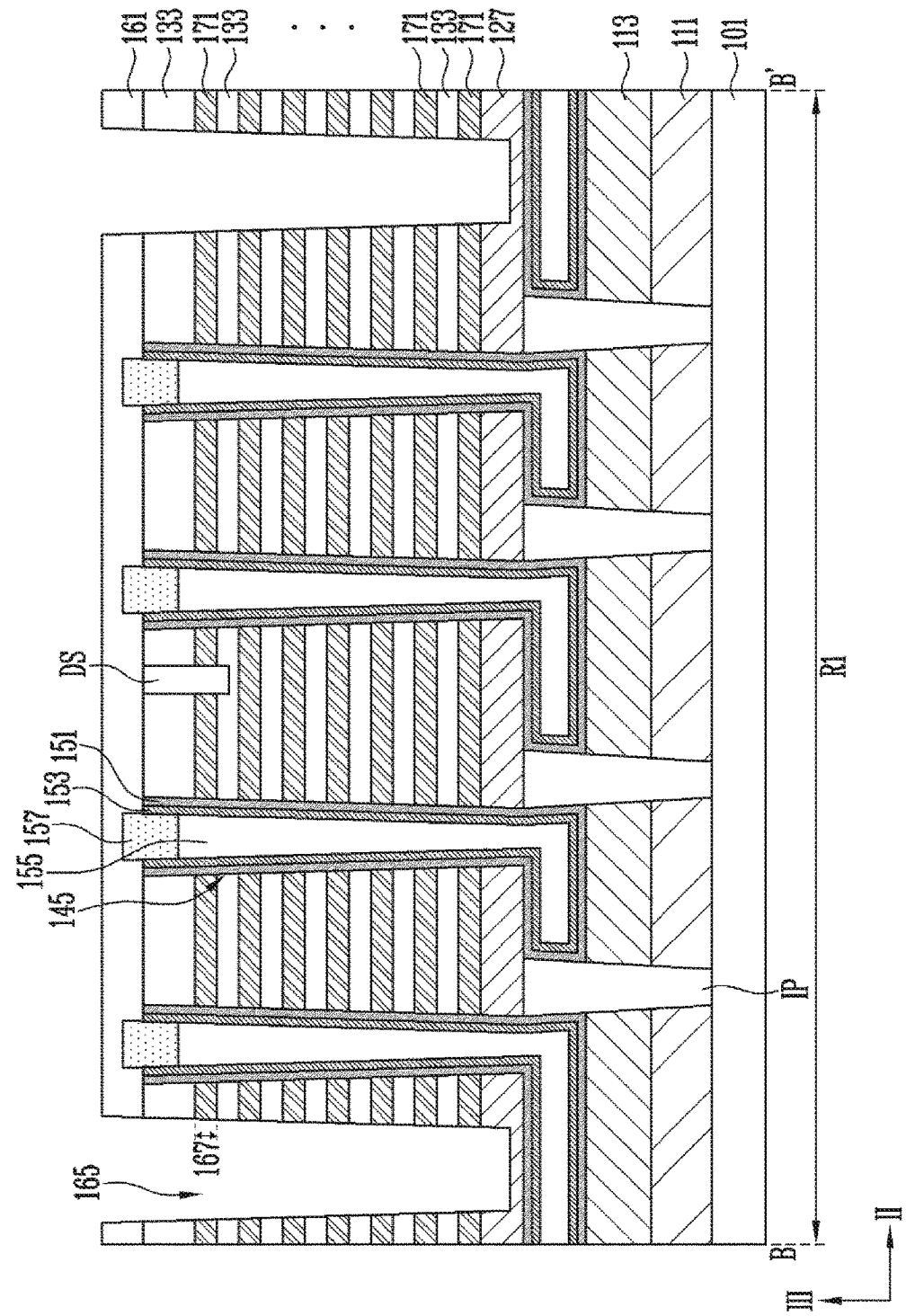

Referring to FIG. 11B, the process of forming the source contact line may further include the step of respectively forming second conductive layers 171 in the gate regions 167. The step of forming the second conductive layers 171 may include the step of forming a third material layer through the first through portion 165 to fill the gate regions 167 with the third material, and the step of removing the third material layer from the first through portion 165 such that the third material layer is separated into the second conductive layers 171. The third material layer may be conductive material forming the second conductive layers 171 and may be a metal layer having a resistance lower than that of the first conductive layer 127. Before the third material layer is formed, an aluminum oxide layer (not shown) may be further formed along surfaces of the gate regions 167. The aluminum oxide layer may function as a blocking insulating layer.

According to the foregoing process described with reference to FIGS. 11A and 11B, the first material layers may be replaced with the second conductive layers 171 through the first through portion 165. In an embodiment, in the case where the first material layers are made of conductive material, the first material layers may remain separated into a plurality of gate electrodes by the first through portion 165 without being replaced with the second conductive layers 171. Namely, the first material layers may be patterned as the gate electrodes.

Figure 11C:
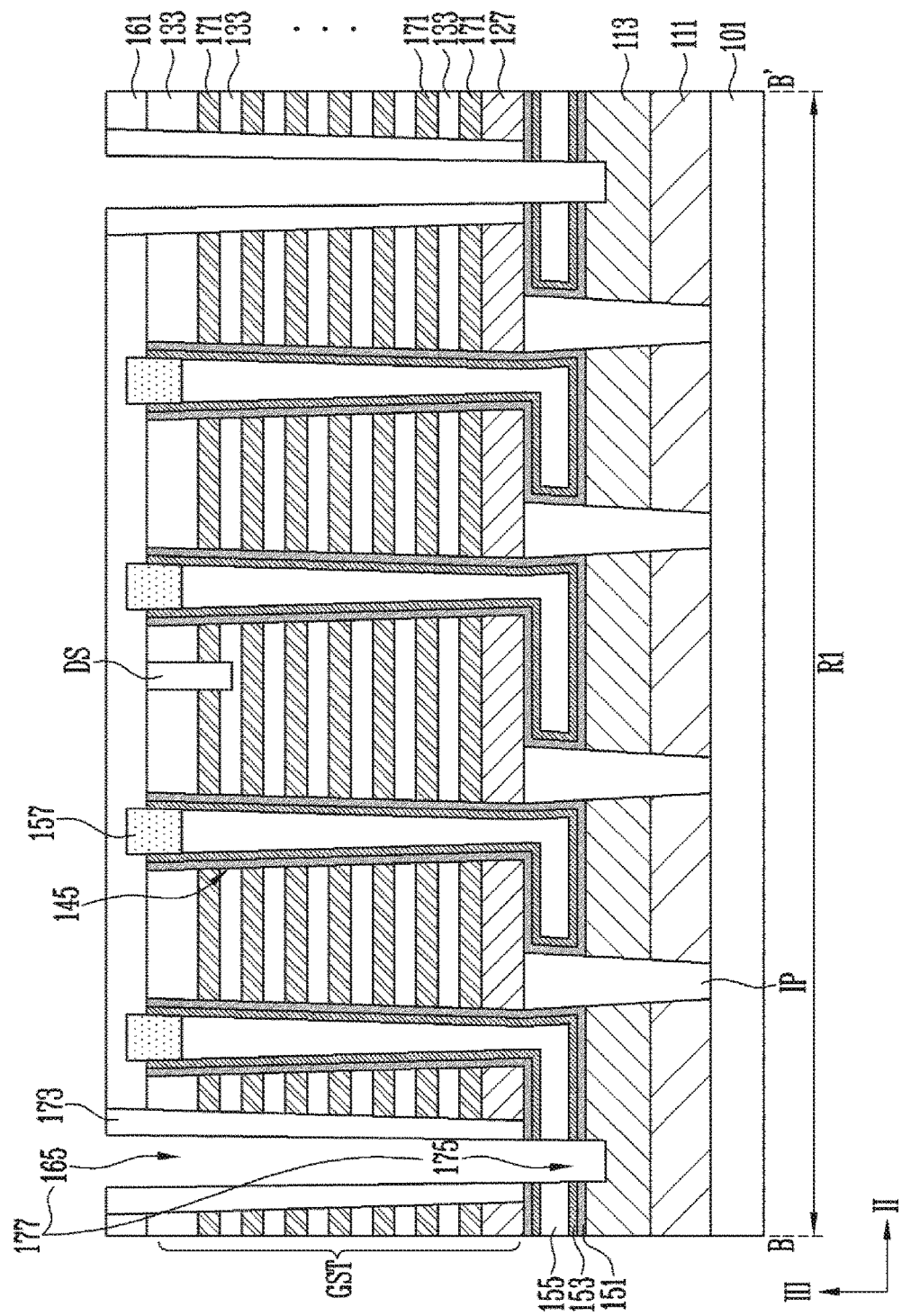
Figure 11D:
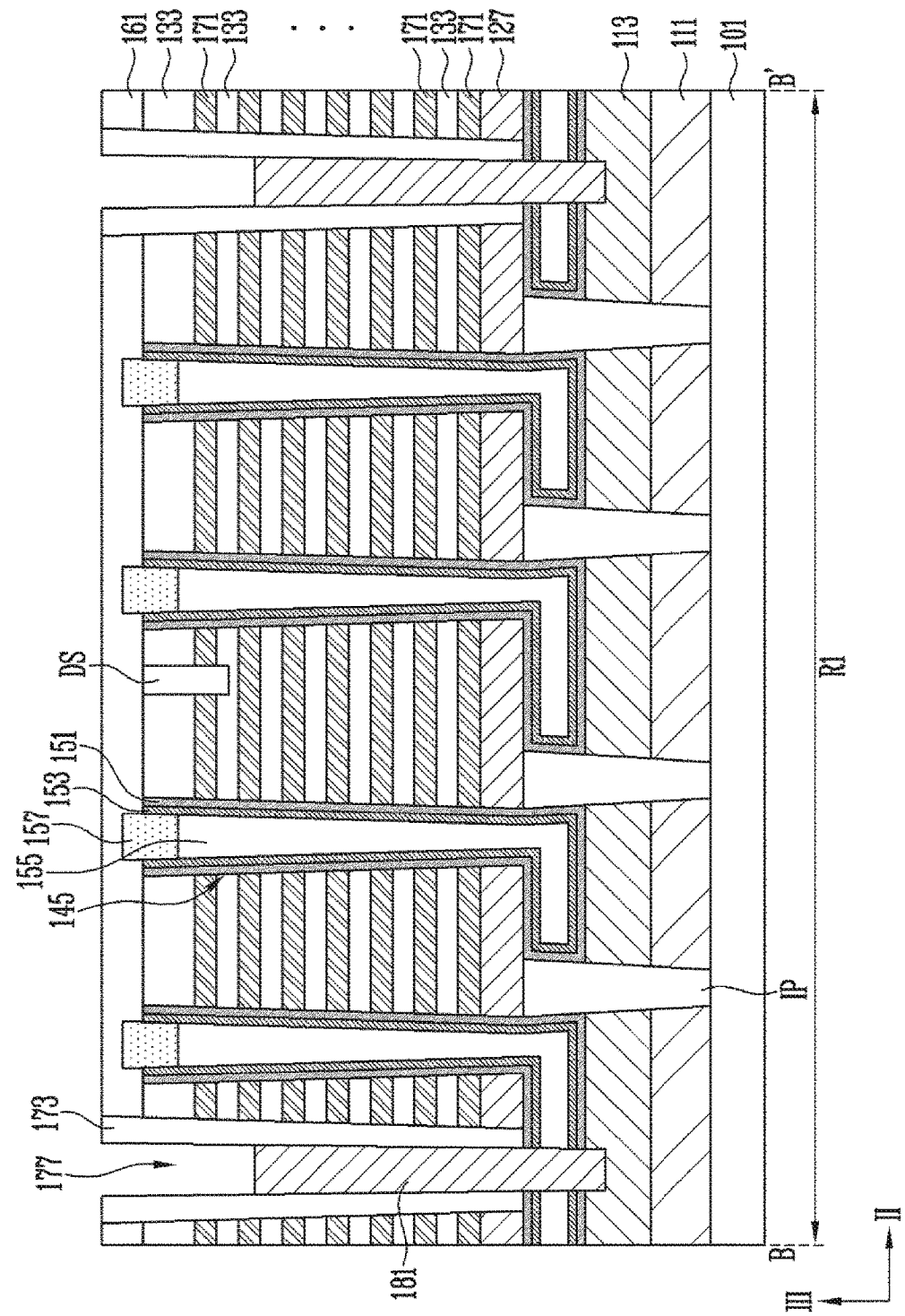

Referring to FIG. 11C, the first through portion 165 may be extended to a depth to which the first conductive layer 127 is penetrated. The first conductive layer 127 may be etched through an etch-back process. Thereby, the gate stacks GST described with reference to FIGS. 2 to 4 may be patterned. The gate stacks GST may be separated by the first through portion 165.

Subsequently, an insulating spacer 173 may be formed on the sidewall of the first through portion 165. The step of forming the insulating spacer 173 may include first depositing an insulating layer along a surface of the first through portion 165, and then etching the insulating layer through an etch-back process. By etching the insulating layer, the multilayer memory layer 151 may be exposed through the bottom of the first through portion 165.

Thereafter, a second through portion 175 is formed by etching the multilayer memory layer 151, the channel layer 153, and the gap-fill insulating layer 155 that are exposed through the bottom of the first through portion 165. The second through portion 175 is coupled with the first through portion 165 and extends toward the source layer 113. The second through portion 175 passes through the multilayer memory layer 151, the channel layer 153 and the gap-fill insulating layer 155, and exposes the source layer 113.

The first through portion 165 and the second through portion 175 define a slit 177 in which the source contact line SCL described in FIG. 2 is to be disposed. The first through portion 165 and the second through portion 175 also extend in the first direction I shown in FIG. 2.

Referring to 11D, a doped semiconductor layer 181 coupled to the source layer 113 and the channel layer 153 may be formed in the slit 177. The doped semiconductor layer 181 may have a height less than that of the slit 177.

The doped semiconductor layer 181 may include a first conductivity type dopant. For example, the first conductivity type dopant may be an n-type dopant. In detail, the doped semiconductor layer 181 may be an n-type doped silicon layer. The first conductivity type dopant of the doped semiconductor layer 181 may be diffused into the channel layer 153 and the source layer 113 that are in contact to the doped semiconductor layer 181.

Figure 11E:
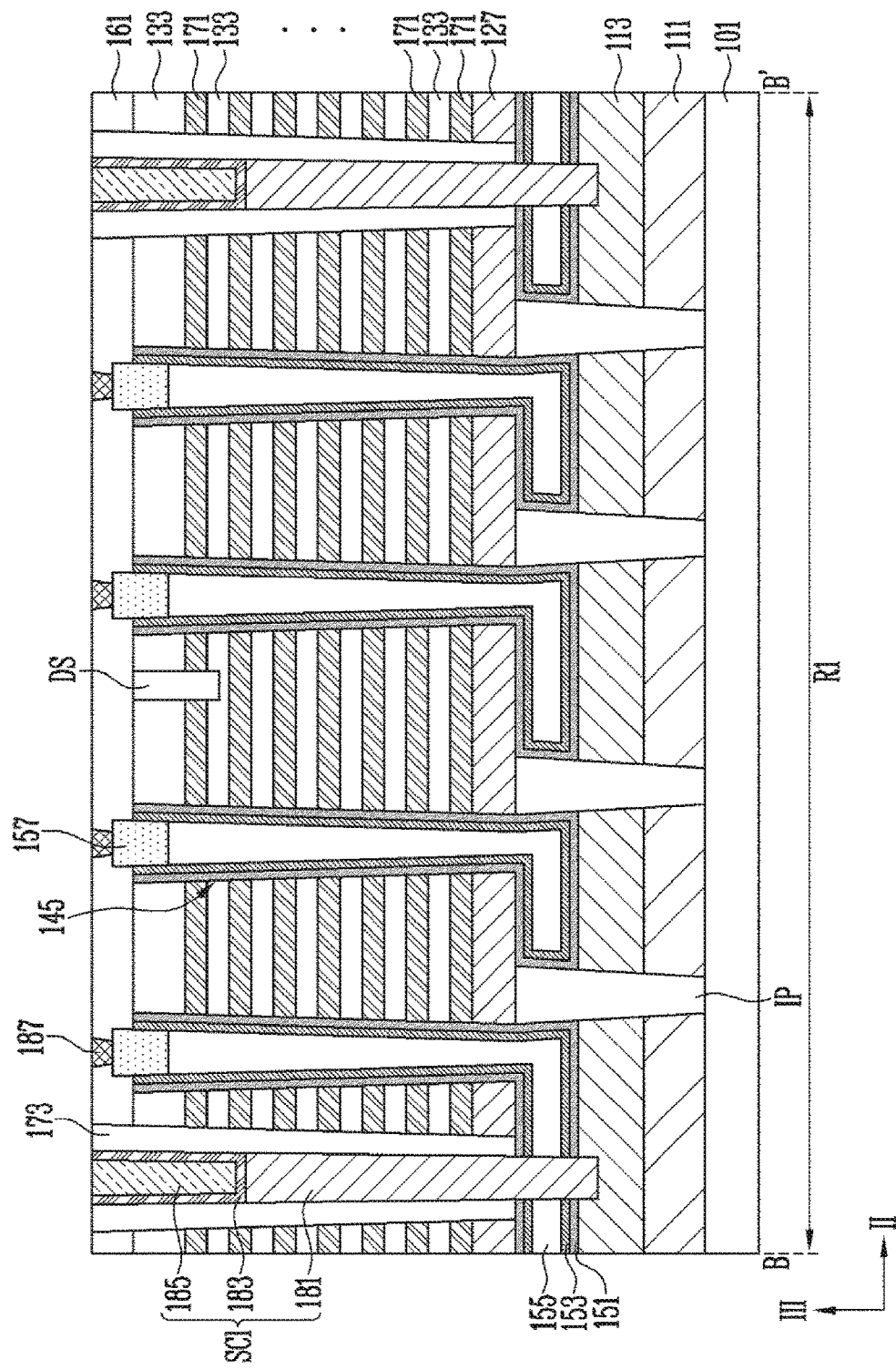

Referring to FIG. 11E, a metal layer 185 may be formed. But before the metal layer 185 is formed, a barrier metal layer 183 may be formed conformally along the surface of the insulating spacer 173 and on the top surface of the doped semiconductor layer 181.

Hence, remainder of the slit 177 which is not filled with the doped semiconductor layer 181 and the barrier metal layer 183 may be completely filled with the metal layer 185. The metal layer 185 may include a metal such as tungsten and/or the like. The barrier metal layer 183 may include a titanium nitride layer, a tungsten nitride layer, a tantalum nitride layer and/or the like.

The source contact line SCL including the doped semiconductor layer 181, the barrier metal layer 183 and the metal layer 185 may be formed through the above-described process.

Subsequently, following processes such as a process of forming bit contact plugs 187 passing through the upper insulating layer 161 may be performed.

Figure 12:
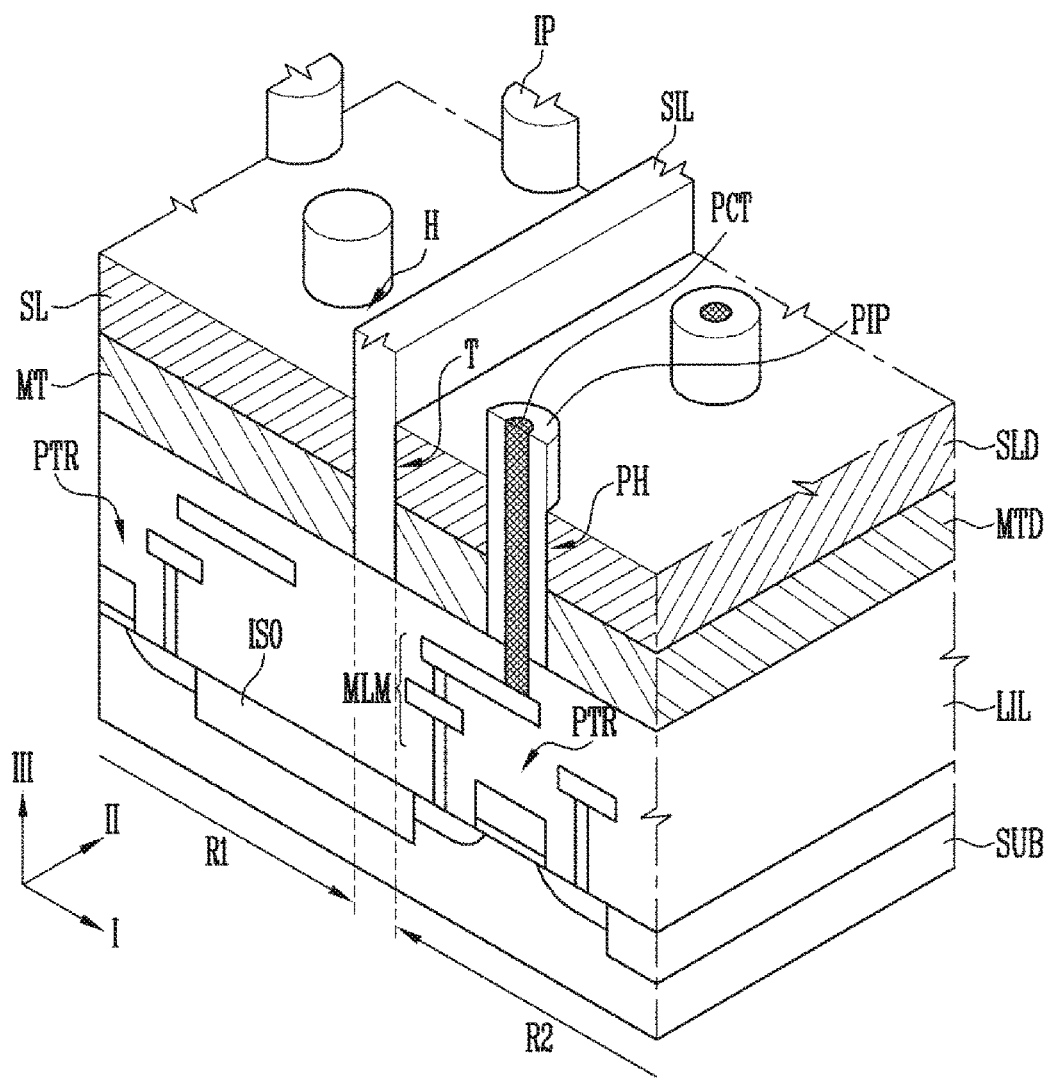
FIG. 12 is a perspective view illustrating a modification of a source separation insulating layer.

FIG. 12 is a perspective view illustrating a modification of the source separation insulating layer SIL. For the sake of description, in FIG. 12, there is illustrated only the structure disposed below the gate stack.

Referring to FIG. 12, as describe with reference to FIGS. 3A and 4, the source separation insulating layer SIL may be directly coupled to the lower insulating layer LIL including the first region R1 and the second region R2. As described in FIG. 4, the lower insulating layer LIL is disposed on the substrate SUB including the driving transistors PTR.

The driving transistors PTR may be insulated from each other by an isolation layer ISO disposed in the substrate SUB. Each of the driving transistors PTR may be coupled to a multilayer metal pattern MLM formed in the lower insulating layer LIL.

Metal layers MT and MTD and source layers SL and SLD may be disposed on the lower insulating layer LIL. The source layers SL and SLD may include a cell source layer SL that remains over the first region R1 of the lower insulating layer LIL, and a dummy source layer SLD that remains over the second region R2 of the lower insulating layer LIL. The cell source layer SL and the dummy source layer SLD are formed of the same material as that of the source layer described with reference to FIGS. 3A and 4.

The metal layers MT and MTD may be formed to reduce the resistance of the source layers SL and SLD as described with reference to FIGS. 3A and 4. The metal layers MT and MTD may include a cell metal layer MT that remains on the first region R1 of the lower insulating layer LIL, and a dummy metal layer MTD that remains on the second region R2 of the lower insulating layer LIL.

The source separation insulating layer SIL may have the form of a line extending along a boundary between the first region R1 and the second region R2. Such source separation insulating layer SIL separates the cell source layer SL from the dummy source layer SLD, and separates the cell metal layer MT from the dummy metal layer MTD.

The dummy source layer SLD and the dummy metal layer MTD may remain to prevent a dishing phenomenon during a process of forming the source separation insulating layer SIL.

The dummy source layer SLD and the dummy metal layer MTD may be penetrated by peripheral insulating pillars PIP extending parallel to the supports IR The peripheral insulating pillars PIP come into directly contact with an upper surface of the lower insulating layer LIL.

The peripheral insulating pillars PIP may be penetrated by peripheral contact plugs PCT. Each of the peripheral contact plugs PCT may extend into the lower insulating layer LIL and be coupled to the multilayer metal pattern MLM corresponding thereto.

In the embodiment of the present disclosure, the second region R2 of the lower insulating layer LIL may overlap the dummy source layer SLD and the dummy metal layer MTD.

The semiconductor device including the structure shown in FIG. 12 may be formed by modifying the process described with reference to FIGS. 6 to 11E.

In detail, to form the source separation insulating layer SIL and the peripheral insulating pillars PIP that are shown in FIG. 12, the shape of the mask for forming the first opening and the second opening described in FIG. 7A may be modified. The second opening according to an embodiment of the present disclosure may include a trench T disposed on a boundary between the first region R1 and the second region R2 of the lower insulating layer LIL, and peripheral holes PH spaced apart from each other on the second region R2 of the lower insulating layer LIL. The trench T passes through the source layer and separates the source layer into the cell source layer SL and the dummy source layer SLD. The trench T passes through the metal layer and separates the metal layer into the cell metal layer MT and the dummy metal layer MTD. Subsequently, the source separation insulating layer SIL and the peripheral insulating pillars PIP are formed simultaneously with the supports IP by performing the process described with reference to FIGS. 7B and 7C. The source separation insulating layer SIL is formed in the trench T, and the peripheral insulating pillars PIP are formed in the respective peripheral holes PH.

Subsequently, the step of forming peripheral contact plugs PCT passing through the respective peripheral insulating pillars PIP may further be performed.

Following processes are the same as those described with reference to FIGS. 8 to 11E.

Figure 13:
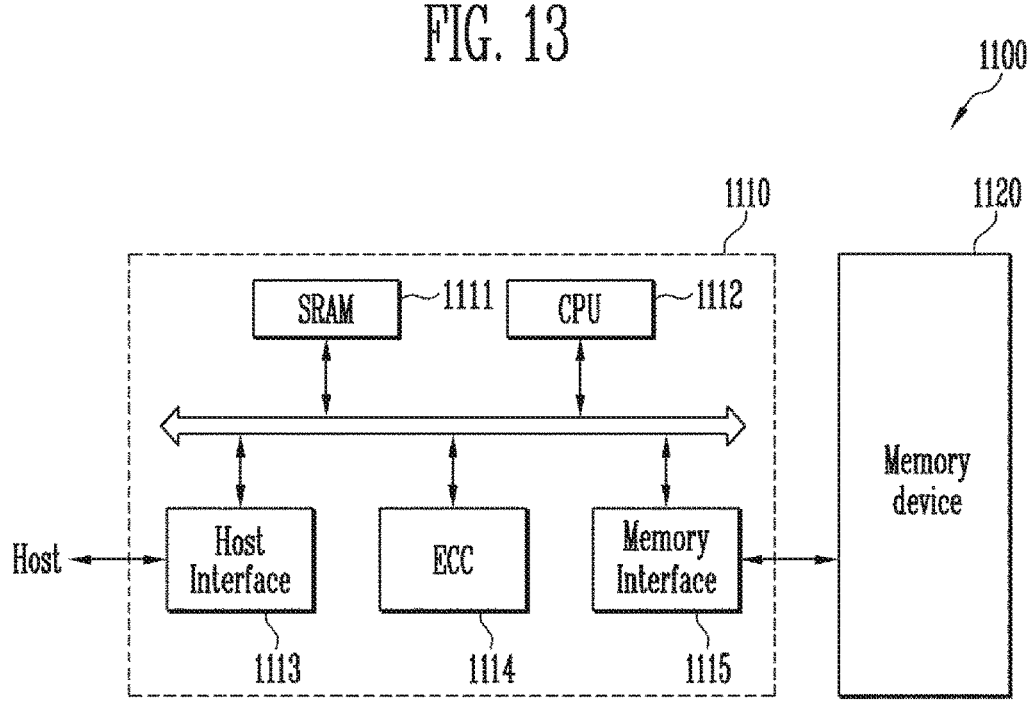
FIG. 13 is a block diagram illustrating the configuration of a memory system according to an embodiment of the present disclosure.

FIG. 13 is a block diagram illustrating the configuration of a memory system 1100 according to an embodiment of the present disclosure.

Referring FIG. 13, the memory system 1100 in accordance with an embodiment includes a memory device 1120 and a memory controller 1110.

As described with reference to FIGS. 2, 3A, 3B, 4 and 12, the memory device 1120 may include the supports coupled to the lower insulating layer disposed below the source layer and supporting between the source layer and the gate stack. Importantly, the supports may be formed by using the process of forming the source separation insulating layer that cuts the source layer, hence, without an additional manufacturing process. Moreover, the supports may be formed more stable than in existing processes, thus providing a sturdier and less error prone three-dimensional semiconductor memory device. In an embodiment, the memory device 1120 may be implemented as a multi-chip package including a plurality of flash memory chips.

The memory controller 1110 may be configured to control the memory device 1120, and may include a static random access memory (SRAM) 1111, a CPU 1112, a host interface 1113, an error correction code (ECC) 1114, and a memory interface 1115. The SRAM 1111 is used as an operation memory of the CPU 1112. The CPU 1112 may perform the overall control operations for data exchange of the memory controller 1110. The host interface 1113 may be provided with a data interchange protocol of a host coupled with the memory system 1100. Furthermore, the ECC 1114 may detect and correct an error included in the data that is read from the memory device 1120, and the memory interface 1115 may interface the controller 1110 with the memory device 1120. In addition, the memory controller 1110 may further include a read only memory (ROM) or the like that stores code data for interfacing with the host.

The above-described memory system 1100 may be implements as one of various semiconductor devices including but not limiting a memory card or a solid state disk (SSD) equipped with the memory device 1120 and the controller 1110. For example, when the memory system 1100 is an SSD, the memory controller 1110 may communicate with an external device (e.g., a host) via one of various interface protocols, such as a universal serial bus (USB), a multimedia card (MMC), a peripheral component interconnection-express (PCI-E), a serial advanced technology attachment (SATA), a parallel advanced technology attachment (PATA), a small computer small interface (SCSI), an enhanced small disk interface (ESDI), and an integrated drive electronics (IDE).

Figure 14:
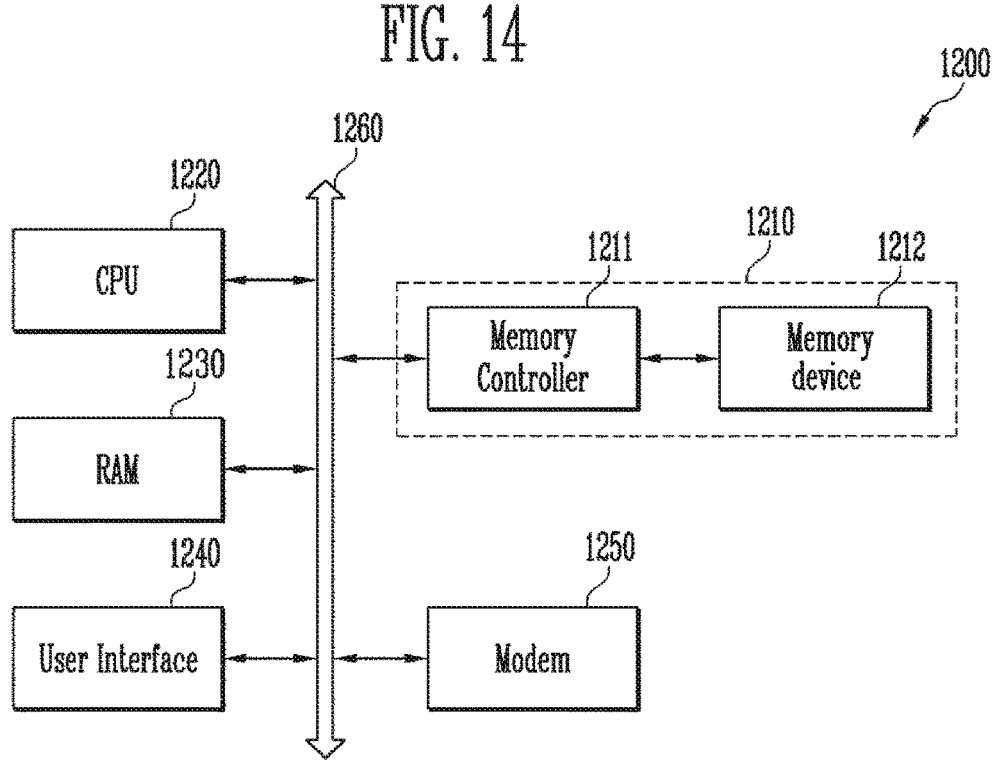
FIG. 14 is a block diagram illustrating the configuration of a computing system in accordance with an embodiment of the present disclosure.

FIG. 14 is a block diagram illustrating the configuration of a computing system 1200 in accordance with an embodiment of the present disclosure.

Referring to FIG. 14, the computing system 1200 may include a CPU 1220, a random access memory (RAM) 1230, a user interface 1240, a modem 1250, and a memory system 1210 that are electrically coupled to a system bus 1260. Furthermore, if the computing system 1200 is a mobile device, it may further include a battery for supplying operating voltage to the computing system 1200. An application chip set, a camera image processor (CIS), a mobile DRAM and the like may be further included.

As described above with reference to FIG. 13, the memory system 1210 may be configured with the memory device 1212 and the memory controller 1211.

In an embodiment of the present disclosure, the structural stability of the semiconductor device may be increased by the supports described above. In an embodiment of the present disclosure, the supports and the source separation insulating layer may be formed through a single mask process, whereby a process of manufacturing the semiconductor device may be simplified. Moreover, the supports may be formed to be more stable than in existing processes, thus providing a sturdier and less error prone three-dimensional semiconductor memory device. In an embodiment, the memory device 1212 may be implemented as a multi-chip package including a plurality of flash memory chips.

Examples of embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A semiconductor device comprising;
   a lower insulating layer;
   a gate stack disposed over the lower insulating layer;
   a plurality of supports extending from the lower insulating layer toward the gate stack;
   a source layer disposed between the lower insulating layer and the gate stack; and
   a channel pattern including a connection part disposed between the source layer and the gate stack,
   wherein each of the supports overlaps a sidewall of the source layer.

2. The semiconductor device according to claim 1, wherein the supports support the gate stack and penetrate the source layer.

3. The semiconductor device according to claim 1, wherein the supports are formed of an insulating material.

4. The, semiconductor device according to claim 1, further comprising a metal layer disposed between the source layer and the lower insulating layer, wherein the metal layer is penetrated by the supports.

5. The semiconductor device according to claim 1, further comprising a source contact line extending from the source layer along a sidewall of the gate stack and contacting with the connection part of the channel pattern and the source layer.

6. The semiconductor device according to claim 1,
   wherein the channel pattern includes pillars extending from the connection part and passing through the gate stack, and
   wherein the connection part surrounds the supports.

7. The semiconductor device according to claim 5, wherein the source contact line comprises a doped semiconductor layer contacting with the source layer and the connection part, and a metal layer formed on the doped semiconductor layer.

8. The semiconductor device according to claim 6,
   wherein the gate stack comprises gate electrodes and interlayer insulating layers that are alternately stacked, and
   wherein the gate electrodes and the interlayer insulating layers surround the pillars.

9. The semiconductor device according to claim 8, wherein the gate electrodes comprise:
   a source select line formed of a stack structure of first conductive material and second conductive material; and
   word lines and a drain select line disposed on the source select line and formed of the second conductive material.

10. The semiconductor device according to claim 8, wherein each of the gate electrodes includes a cell array region and a contact region, and
    wherein the gate electrodes are patterned to form a stepped structure in the contact region whereby an end of each gate electrode is exposed through the stepped structure.

11. The semiconductor device according to claim 8, wherein the pillars are not overlapping the supports.

12. The semiconductor device according to claim 10, wherein the plurality of pillars are spaced apart in the cell array region a zigzag configuration.

13. The semiconductor device according to claim 12, wherein the plurality of pillars are divided into a first group and a second group,
    wherein each group is controlled by a different drain select line, and
    wherein the first and second groups share a common select line and a plurality of common word lines.

14. A semiconductor device comprising:
    a lower insulating layer;
    a gate stack disposed over the lower insulating layer;
    a plurality of supports extending from the lower insulating layer toward the gate stack;
    a source layer disposed between the lower insulating layer and the gate stack;
    a channel pattern including a connection part disposed between the source layer and the gate stack; and
    a source separation insulating layer having a sidewall that is coplanar with an edge of the source layer, and the source separation insulating layer extending onto a sidewall of the connection part.

15. The semiconductor device according to claim 14, further comprising:
    a dummy source layer facing the source layer with the source separation insulating layer interposed therebetween;
    peripheral insulating pillars passing through the dummy source layer and extending parallel to the supports;
    peripheral contact plugs passing through the respective peripheral insulating pillars and extending into the lower insulating layer; and
    driving transistors coupled to the respective peripheral contact plugs.

16. The semiconductor device according to claim 14, wherein the source separation insulating layer and the supports are formed of the same material.

17. A semiconductor device comprising:
    a lower insulating layer;
    a gate stack disposed over the lower insulating layer;
    a plurality of supports extending from the lower insulating layer toward the gate stack;
    a source layer disposed between the lower insulating layer and the gate stack; and
    a channel pattern including a connection part disposed between the source layer and the gate stack,
    wherein the lower insulating layer includes a first region and a second region, and
    wherein the supports extend from the first region of the lower insulating layer.

18. The semiconductor device, according to claim 17, further comprising a driving transistor disposed below the lower insulating layer to overlap at least one of the first and second regions, and configured to form a peripheral circuit.

19. The semiconductor device according to claim 17, wherein the plurality of supports are arranged in a zigzag configuration.

20. The semiconductor device according to claim 17, further comprising a source separation insulating layer having a sidewall that is coplanar with an edge of the source layer, the source separation insulating layer extending onto a sidewall of the connection part, and wherein the source separation insulating layer and the supports are made of a same material.

* * * * *